United States Patent
Ueno et al.

(10) Patent No.: US 8,928,003 B2
(45) Date of Patent: Jan. 6, 2015

(54) NITRIDE SEMICONDUCTOR DEVICE

(75) Inventors: Katsunori Ueno, Yokohama (JP); Shusuke Kaya, Yokohama (JP)

(73) Assignees: Furukawa Electric Co., Ltd., Tokyo (JP); Fuji Electric Co., Ltd., Kanagawa (JP)

( * ) Notice: Subject to any disclaimer, the term of this patent is extended or adjusted under 35 U.S.C. 154(b) by 0 days.

(21) Appl. No.: 13/979,090

(22) PCT Filed: Oct. 26, 2011

(86) PCT No.: PCT/JP2011/074712
§ 371 (c)(1),
(2), (4) Date: Jul. 10, 2013

(87) PCT Pub. No.: WO2012/144100
PCT Pub. Date: Oct. 26, 2012

(65) Prior Publication Data
US 2013/0292699 A1    Nov. 7, 2013

(30) Foreign Application Priority Data
Apr. 22, 2011 (JP) ................. 2011-096618

(51) Int. Cl.
H01L 29/15 (2006.01)
H01L 29/423 (2006.01)
H01L 29/66 (2006.01)
H01L 29/20 (2006.01)
H01L 29/40 (2006.01)
H01L 29/778 (2006.01)

(52) U.S. Cl.
CPC ........ *H01L 29/778* (2013.01); *H01L 29/42316* (2013.01); *H01L 29/42376* (2013.01); *H01L 29/66462* (2013.01); *H01L 29/2003* (2013.01); *H01L 29/407* (2013.01); *H01L 29/402* (2013.01); *H01L 29/7787* (2013.01)
USPC ............................. 257/76; 438/149

(58) Field of Classification Search
CPC .................................................. H01l 21/02458
USPC ............................................. 257/76; 438/149
See application file for complete search history.

(56) References Cited

U.S. PATENT DOCUMENTS 6,900,537 B2   5/2005   Sridevan
7,038,253 B2   5/2006   Yoshida et al.
(Continued)

FOREIGN PATENT DOCUMENTS

JP    2007273795 A   10/2007
JP    2010147387 A    7/2010
(Continued)

OTHER PUBLICATIONS

Proceedings of International Symposium on Power Semiconductor Device and IC's "Enhancement-mode GaN Hybrid MOS-HEMTs with Ron,sp of 20mΩ-cm2"(2008) pp. 295-298.
(Continued)

*Primary Examiner* — Jami M Valentine
(74) *Attorney, Agent, or Firm* — Lowe, Hauptman & Ham, LLP

(57) ABSTRACT

The present invention prevents breakage of a gate insulating film of a MOS device and provides a nitride semiconductor device having improved reliability. An SBD metal electrode provided between a drain electrode and a gate electrode is configured to form a Schottky junction with an AlGaN layer. Further, the SBD metal electrode and a source electrode are connected and electrically short-circuited. Consequently, when an off signal is inputted to the gate electrode, a MOSFET part is turned off and the drain-side voltage of the MOSFET part becomes close to the drain electrode voltage. When the drain electrode voltage increases, the SBD metal electrode voltage becomes lower than the drain-side voltage of the MOSFET part, thus the drain side of the MOSFET part and the drain electrode are electrically disconnected by the SBD metal electrode.

15 Claims, 23 Drawing Sheets

(56) References Cited

U.S. PATENT DOCUMENTS

2007/0228422 A1    10/2007    Suzuki et al.
2010/0155780 A1*   6/2010     Machida et al. .............. 257/192
2011/0049529 A1    3/2011     Sato et al.

FOREIGN PATENT DOCUMENTS

JP    2010272728 A    12/2010
JP    2011082415 A    4/2011
WO    03071607 A1    8/2003

OTHER PUBLICATIONS

International Search Report corresponding to PCT/JP2011/074712 dated Jan. 24, 2012.

* cited by examiner

NITRIDE SEMICONDUCTOR DEVICE

RELATED APPLICATIONS

The present application is a National Phase of International Application Number PCT/JP2011/074712, filed Oct. 26, 2011, and claims priority from Japanese Application Number 2011-096618, filed Apr. 22, 2011.

TECHNICAL FIELD

The present invention relates to a normally-off nitride semiconductor device having a MOS structure.

BACKGROUND ART

Conventionally, a gallium nitride (GaN) compound semiconductor device (hereinafter called a GaN semiconductor element) is used as a semiconductor material in semiconductor elements for high-frequency devices. In a GaN semiconductor element, a buffer layer formed by using, for example, a Metal-Organic Chemical Vapor Deposition (MOCVD) method, and an electron traveling layer that is doped with impurities, are provided on the surface of a substrate. Recently, because it has been recognized that GaN semiconductor elements can be applied as well to semiconductor devices for power (power devices) in addition to high-frequency applications, studies are being carried out on GaN semiconductor elements that handle high withstand voltages and large currents.

A gallium nitride semiconductor element having a MOS structure is disclosed in Patent Document 1. A schematic structural view of the gallium nitride semiconductor element having a MOS structure that is disclosed in Patent Document 1 is shown in FIG. 21. As shown in FIG. 21, at a conventional gallium nitride semiconductor element 1000, a GaN layer 1016, that functions as an electron traveling layer, and an AlGaN layer 1020, that functions as an electron supplying layer, are layered on a substrate 1012 via a buffer layer 1014 for layering GaN crystals, and a heterojunction structure is formed. In the gallium nitride semiconductor of FIG. 21, two-dimensional electron gas (2DEG: hereinafter called 2DEG), that is formed directly beneath the interface of the GaN layer 1016 and the AlGaN layer 1020 (at the surface of the GaN layer 1016), is utilized as a carrier.

A recess portion 1021 is formed in a portion of the surface of the AlGaN layer 1020. A gate electrode 1028 is disposed via a gate insulating film 1022 in this recess portion 1021, and a MOS (n-type MOS) structure (a MOSFET portion) is structured.

When voltage is applied to the gate electrode 1028, electrons collect at the surface of the GaN layer 1016 that contacts the gate insulating film 1022, and a MOS channel is formed (enters into an on state), and the MOS channel is electrically connected to a 2DEG layer 1018 that is formed at the interface of the GaN layer 1016 and the AlGaN layer 1020, and a source electrode 1024 and a drain electrode 1026 enter into an electrically conductive state.

Further, in a case in which the MOS channel is in an off state, when voltage is applied between the source electrode 1024 and the drain electrode 1026, the 2DEG layer 1018 depletes from the gate end portion and a high withstand voltage can be maintained, and the gallium nitride semiconductor element 1000 functions as a high-power and high-withstand-voltage semiconductor element. Therefore, the development of nitride semiconductor elements as semiconductor elements for electric power, that are high-frequency and highly efficient, has advanced in recent years. Conventionally, devices that are called so-called HEMTs in which the gate portion is a Schottky junction have mainly been developed. Attention has been paid to such devices because the driving circuit is simpler at the insulating gate, and it is easy to use the device as a so-called normally-off device that is in an electrically off state when the gate voltage that is applied to the MOSFET portion is 0 V (when gate voltage is not applied).

Because the gallium nitride semiconductor element 1000 is used as a semiconductor element for electric power, there are the great advantages that the gallium nitride semiconductor element 1000 operates at high speed and the conduction resistance thereof is low. On the other hand, it has been learned that, when attempting to deplete the 2DEG layer 1018, there are cases in which the problem often arises that a large electrical field concentrates at a drain side end portion 1023 of the MOSFET portion and the gate insulating film 1022 is broken. It has been learned that the cause of this is that holes that are generated by the high electrical field concentrate at the gate insulating film 1022 and at the AlGaN layer 1020/GaN layer 1016 interface that is near to the gate insulating film 1022, and almost all of the voltage that is applied to the drain electrode 1026 is applied to the gate insulating film 1022.

Moreover, even if the gate insulating film 1022 is not broken, if a large voltage is continually applied to the drain electrode 1026 over a long period of time, there are cases in which there arises the problem of reliability such that a high electrical field is applied to the gate insulating film 1022 over a long period of time, and the characteristic thereof deteriorates over time.

In order to prevent this, it has been though to make the electron concentration of the 2DEG be a concentration of less than or equal to around $2 \times 10^{12}$ cm$^{-2}$. Due thereto, the 2DEG is easily depleted, and the effect of maintaining the withstand voltage is obtained. However, when the concentration of the 2DEG is lowered, the conduction resistance of the 2DEG layer 1018 portion becomes large, and therefore, the on resistance of the element on the whole rises, and there is the drawback that the intrinsic advantages of a nitride semiconductor are lost.

Further, an example of another means therefor is a means that is called a field plate at the drain side end portion of the gate electrode 1028, in which the gate electrode 1028 is extended on an insulating film that is thicker than the gate insulating film 1022, and the electrical field of the thin gate insulating film 1022 portion is moderated. However, it has become clear that, with this means, in a case in which the electron concentration of the 2DEG is greater than or equal to $3 \times 10^{12}$ cm$^{-2}$, it is difficult to protect the gate insulating film 1022.

Still further, an example of another means is a means in which, by making the GaN layer 1016 be p-type, the holes that collect at the periphery of the gate insulating film 1022 are discharged to the p-type region, and the 2DEG layer 1018 is made to be easily depleted. This means has the advantage that, as shown in Non-Patent Document 1 for example, it is easy to widen the depletion layer by controlling the accepter concentration, and a high withstand voltage can be achieved. However, it is generally difficult to form a p-type layer of gallium nitride, and further, it is extremely difficult to carry out concentration control at around $1 \times 10^{17}$ cm$^{-3}$. In particular, in cases in which the substrate 1012 is formed of silicon, it is difficult to obtain a p-type layer itself. Namely, an extremely limited range of concentration and selection of substrate crystal are required.

Further, in the structure of FIG. 21, because the source side and the drain side have a basically contrasting structure across the gate electrode 1028, there is no so-called freewheeling diode (hereinafter called FWD). Therefore, for example, if a nitride semiconductor element is used as an inverter or the like, a diode bearing the function of an FWD must be connected in parallel to the exterior of the nitride semiconductor element.

On the other hand, Patent Document 2 discloses a high-withstand-voltage power device that is a normally-on device and in which a so-called high-withstand-voltage JFET (Junction-Field-Effect-Transistor) and a low-withstand-voltage MOSFET are cascode-connected in series. The connected state of this JFET and MOSFET is shown in FIG. 22. This is a structure in which the gate terminal of the JFET short circuits with the source of the MOSFET that is connected in series, and, when viewed from the exterior, it is attempted to operate this power device as if it were an insulating gate device. Because a MOSFET can use a device that has low withstand voltage and on-resistance, the JFET is normally-on. However, an SiC MOSFET, that has high withstand voltage and low resistance, is connected to a low-withstand-voltage silicon MOSFET, and a device, that is normally-off and has low on-resistance and high withstand voltage, is realized.

On the other hand, for example, the nitride semiconductor element shown in Patent Document 3, such as shown in FIG. 23, is known. A semiconductor element 2000 shown in FIG. 23 is structured to include a reverse surface electrode 2035, a substrate 2012, a buffer layer 2014, an electron traveling layer 2016, a 2DEG layer 2018, an electron supplying layer 2020, an insulating film 2033, a source electrode 2024, a drain electrode 2026, a gate electrode 2028, and a Schottky electrode 2031. In the semiconductor element 2000, the source electrode 2024, the drain electrode 2026, the gate electrode 2028 and the Schottky electrode 2031 are formed directly on the electron supplying layer 2020. Due to the Schottky electrode 2031, that is provided between the drain electrode 2026 and the gate electrode 2028, short circuiting with the source electrode 2024, high-speed operation is realized. A recess is not formed in the gate electrode 2028 portion of this nitride semiconductor element, and the problem of a large electrical field concentrating at the drain side end portion 1023 in FIG. 21 and the gate insulating film 1022 being broken such as in Patent Document 1, does not arise. However, because the nitride semiconductor element shown in Patent Document 3 is a normally-on type, safety at the time of a failure cannot be ensured.

Patent Document 1: Pamphlet of International Publication No. 2003/071607

Patent Document 2: U.S. Pat. No. 6,900,537

Patent Document 3: Japanese Patent Application Laid-Open No. 2007-273795

Non-Patent Document 1: Proceedings of International Symposium on Power Semiconductor Device and IC's "Enhancement-mode GaN Hybrid MOS-HEMTs with Ron, sp of 20 mΩ-cm2" (2008) pp. 295-298

DISCLOSURE OF INVENTION

Technical Problem

The present invention has been made in consideration of the above, and an object thereof is to provide a nitride semiconductor device that prevents destruction of a gate insulating film of a MOS-type device and that has improved reliability.

Solution to Problem

The nitride semiconductor device of Claim 1 comprises: a substrate; a buffer layer that is formed on the substrate; an electron traveling layer that is formed on the buffer layer and is formed of a nitride compound; an electron supplying layer that is formed on the electron traveling layer, and whose band gap energy is different than the electron traveling layer, and that is formed from at least one layer; a recess portion that is formed in a region from a surface of the electron supplying layer at least until reaching the electron supplying layer; a source electrode and a drain electrode that are formed on the electron supplying layer at positions opposing one another across the recess portion; a gate insulating film that is formed from the recess portion over a surface of the electron supplying layer, so as to cover the recess portion interior; a gate electrode that is formed on the gate insulating film that is within the recess portion; and an electrode for carrier transport that is formed between the gate electrode and the drain electrode, and is connected to the source electrode, and is for transporting carrier to the source electrode.

In the nitride semiconductor device of Claim 2, in the nitride semiconductor device of Claim 1, the electrode for carrier transport is Schottky joined to at least one of the electron supplying layer and the electron traveling layer.

In the nitride semiconductor device of Claim 3, in the nitride semiconductor device of Claim 2, the electrode for carrier transport is formed at a region from a surface of the electron supplying layer to a depth that reaches the electron supplying layer interior or the electron traveling layer interior.

In the nitride semiconductor device of Claim 4, the nitride semiconductor device of Claim 1 comprises a semiconductor layer that is pn-joined to the electron supplying layer, wherein the electrode for carrier transport is ohmically-joined on the semiconductor layer.

In the nitride semiconductor device of Claim 5, the nitride semiconductor device of any one of Claim 1 through Claim 4 comprises: a first n+ layer that is formed at a region beneath the gate insulating film from the source electrode until reaching a region beneath the recess portion, and that is connected to the source electrode; and a second n+ layer that is formed at a region beneath the gate insulating film from a region beneath the recess portion until reaching before the electrode for carrier transport, and that is not connected to the electrode for carrier transport.

In the nitride semiconductor device of Claim 6, in the nitride semiconductor device of Claim 5, the electron supplying layer and the electron traveling layer of a region beneath the drain electrode are n+ layers.

In the nitride semiconductor device of Claim 7, in the nitride semiconductor device of any one of Claim 1 through Claim 6, the electron traveling layer is formed of undoped GaN, and a thickness thereof is greater than or equal to 2 nm and less than or equal to 500 nm.

In the nitride semiconductor device of Claim 8, in the nitride semiconductor device of any one of Claim 1 through Claim 7, the electron supplying layer is formed of AlGaN, and a thickness thereof is greater than or equal to 1 nm and less than or equal to 50 nm.

In the nitride semiconductor device of Claim 9, in the nitride semiconductor device of any one of Claim 1 through Claim 8, a carrier concentration of two-dimensional electron gas that is generated at the electron traveling layer is greater than or equal to $2\times10^{12}$ cm$^{-2}$ and less than or equal to $2\times10^{13}$ cm$^{-2}$.

In the nitride semiconductor device of Claim 10, in the nitride semiconductor device of any one of Claim 1 through Claim 9, the electron supplying layer has a layered structured in which at least two types of layers, whose compositions are different, are layered repeatedly.

In the nitride semiconductor device of Claim 11, in the nitride semiconductor device of any one of Claim 1 through Claim 10, the electron supplying layer has, between the electron supplying layer and the electron traveling layer, a layer that is formed of AlN.

In the nitride semiconductor device of Claim 12, the nitride semiconductor device of any one of Claim 1 through Claim 11 comprises a field mitigating layer at a region between the electron supplying layer and the gate insulating film, other than a periphery of the recess portion, wherein the gate insulating film has a multi-step structure that corresponds to a step between the electron supplying layer and the field mitigating layer.

In the nitride semiconductor device of Claim 13, the nitride semiconductor device of any one of Claim 1 through Claim 12 comprises a cap layer that is formed of GaN, at least at a region where the source electrode, the drain electrode and the electrode for carrier transport are not formed, of the surface of the electron supplying layer.

In the nitride semiconductor device of Claim 14, the nitride semiconductor device of any one of Claim 1 through Claim 13 comprises a protective film that is formed so as to cover a surface of the electron supplying layer at which the source electrode, the drain electrode and the electrode for carrier transport are formed.

Advantageous Effects of Invention

The effect is achieved that there can be provided a nitride semiconductor device that prevents destruction of a gate insulating film of a MOS-type device and that has improved reliability.

BEST MODES FOR CARRYING OUT THE INVENTION

[First Embodiment]

A nitride semiconductor device of the present embodiment is described in detail hereinafter with reference to the drawings. Note that the present embodiment is an example of the semiconductor device of the present invention, and the present invention is not limited by the present embodiment.

Figure 1:
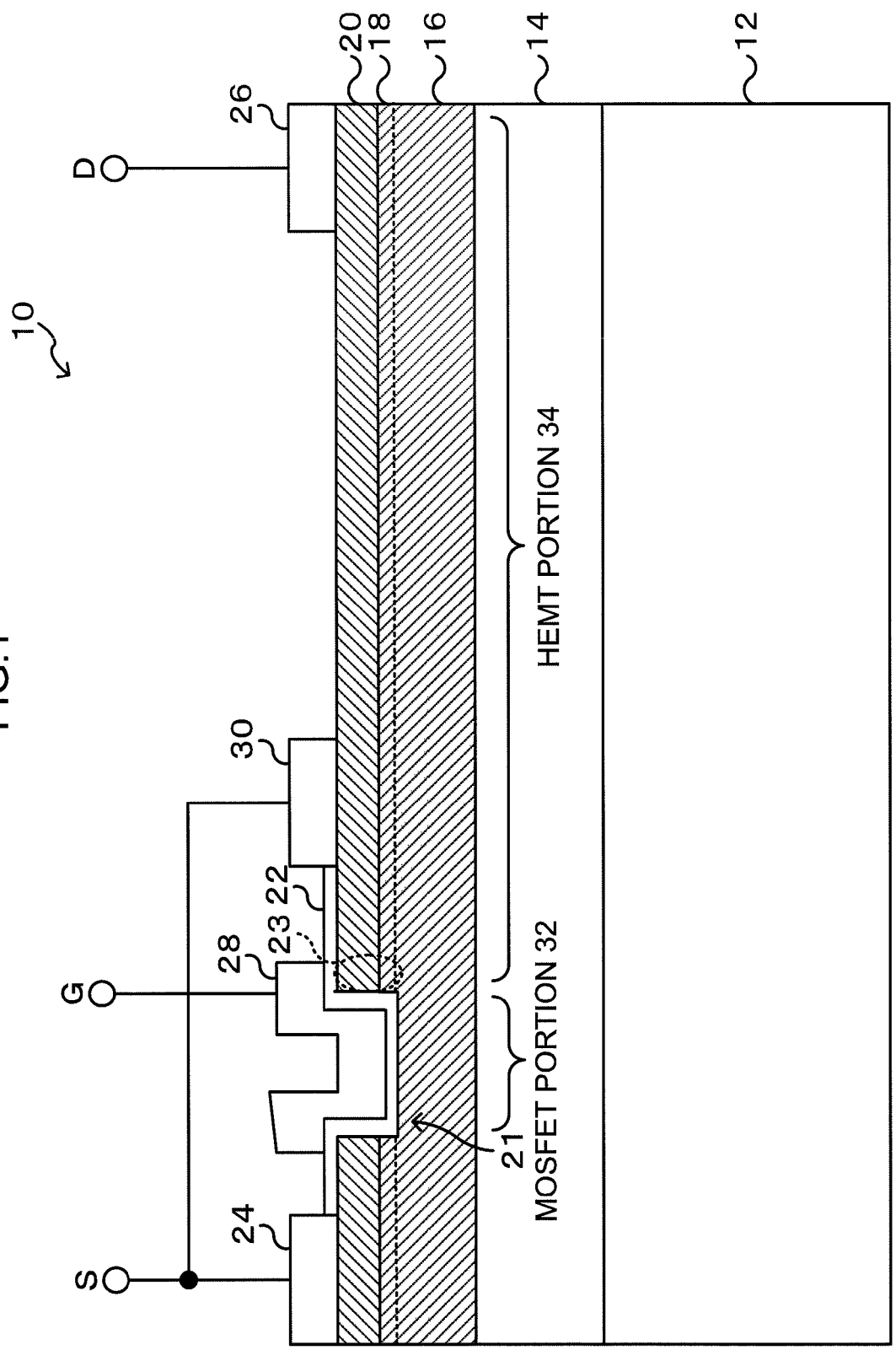
FIG. 1 is a cross-sectional view showing an example of the schematic structure of a nitride semiconductor element relating to a first embodiment of the present invention.

A cross-sectional view showing an example of the schematic structure of a nitride semiconductor element, that is the nitride semiconductor device of the present embodiment, is shown in FIG. 1.

A nitride semiconductor element 10 of the present embodiment is structured to have a substrate 12, a buffer layer 14, a GaN layer 16, an AlGaN layer 20, a gate insulating film 22, a source electrode 24, a gate electrode 28, a drain electrode 26, the gate electrode 28, and an SBD (Schottky Barrier Diode) metal electrode 30. Further, when viewed as equivalent circuits, the nitride semiconductor element 10 of the present embodiment is structured from a MOSFET portion 32 and an HEMT (High Electron Mobility Transistor) portion 34.

Substrates at which a nitride compound semiconductor of silicon, sapphire, SiC, $ZrB_2$, Si, GaN, MgO or the like can be crystal-grown, are concrete examples of the substrate 12. The buffer layer 14 is a layer having a function for layering GaN crystals, and GaN, AlGaN or the like can be used therefor. It suffices for the buffer layer 14 to lattice-match the GaN crystals that form the electron traveling layer (the GaN layer 16 in the present embodiment) that is formed on the buffer layer 14.

The GaN layer 16 functions as an electron traveling layer, and is formed of undoped GaN or the like. Further, the GaN layer 16 may be N-type or may be P-type. The AlGaN layer 20 functions as an electron supplying layer, and is formed of AlGaN that has different band gap energy than the GaN layer 16. Further, the AlGaN layer 20 may have a structure of plural layers having different Al concentrations. Band offset is formed at the interface of the GaN layer 16 and the AlGaN layer 20, and, due to positive charges being generated by spontaneous polarization and piezo polarization of the AlGaN layer 20 and the GaN layer 16 at the AlGaN/GaN interface, a 2DEG is generated at the surface of the GaN layer 16. In the present embodiment, the surface layer of the GaN layer 16 at which the 2DEG is generated is called a 2DEG layer 18. At this time, the amount of the positive charges is controlled by adjusting the film thicknesses and the Al composition of the GaN layer 16 and the AlGaN layer 20. Note that, in the present embodiment, the thickness of the GaN layer 16 is preferably greater than or equal to 2 nm and less than or equal to 500 nm. Further, the thickness of the AlGaN layer 20 is greater than or equal to 1 nm and less than or equal to 50 nm, and the Al composition ratio is preferably greater than or equal to 0.01 and less than or equal to 0.99.

The combination of the electron traveling layer and the electron supplying layer is not limited to the combination of GaN/AlGaN, and it suffices for there to be a combination of materials that is such that the band gap energy of the electron supplying layer is greater than that of the electron traveling layer. The combination may be a combination of, for example, GaN/AlInGaN, InGaN/GaN, GaNAs/GaN, GaInNAsP/GaN, GaInNP/GaN, GaNP/GaN, GaN/AlGaInNAsP, or AlInGaN/AlGaN. Even in cases of these combinations, it suffices to appropriately adjust the film thicknesses and the composition ratios of the electron supplying layer and the electron traveling layer in order to make the concentration of the 2DEG be within an optimal range.

In the present embodiment, a recess portion 21 is formed so as to pass through the AlGaN layer 20 and to a depth that reaches the GaN layer 16. As shown in FIG. 1, the gate insulating film 22 is formed so as to cover the interior of the recess portion 21 and the surface of the AlGaN layer 20 (the surface between the gate electrode 28 and the source electrode 24, and the surface between the gate electrode 28 and the drain electrode 26). $SiO_2$ or $Al_2O_3$, SiN, SiON, or a composite film thereof can be used as the gate insulating film 22.

The source electrode 24 and the drain electrode 26 are ohmic electrodes, and are formed directly on the AlGaN layer 20. The gate electrode 28 is formed in the recess portion 21, and, in the present embodiment, the portion beneath the gate electrode 28 (the portion beneath the MOSFET portion) is the GaN layer 16.

The SBD metal electrode 30 is formed so as to be Schottky-joined to the AlGaN layer 20, at a position on the AlGaN layer 20 at the outer side of an end portion 23, at the drain electrode 26 side, of the gate electrode 28, and is electrically connected to the source electrode 24.

Figure 2:
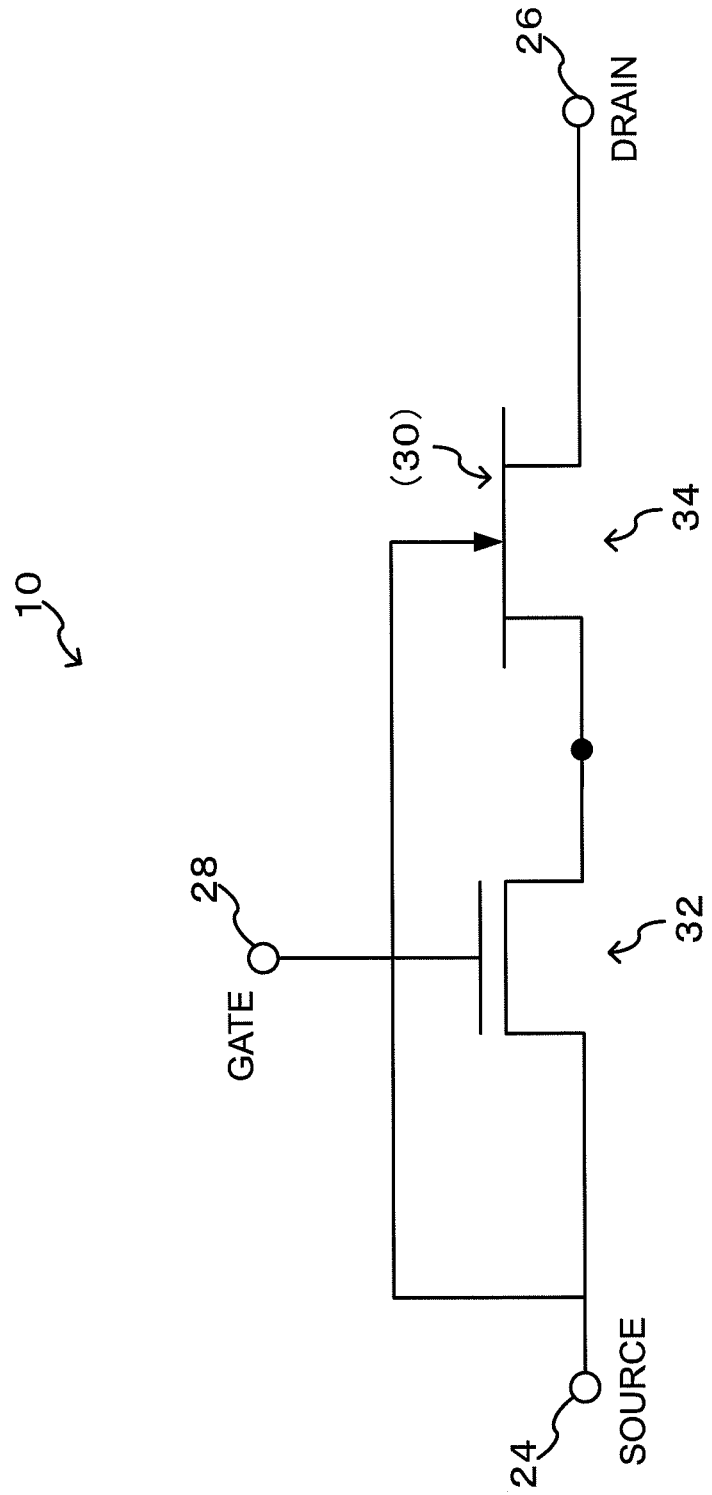
FIG. 2 is a circuit diagram showing an equivalent circuit of the nitride semiconductor element shown in FIG. 1.

An equivalent circuit diagram of the nitride semiconductor element 10 shown in FIG. 1 is shown in FIG. 2. When an off signal is inputted to the gate electrode 28, because the nitride semiconductor element 10 of the present embodiment is a device that is normally-off, the MOSFET portion 32 enters into an off state. Because the voltage of the drain side of the MOSFET portion 32 is near the voltage value of the drain electrode 26, when the voltage of the drain electrode 26 rises, the voltage value of the SBD metal electrode 30 becomes lower than the voltage value of the drain side of the MOSFET portion 32. Therefore, the drain side of the MOSFET portion 32 and the drain electrode 26 are electrically disconnected by the SBD metal electrode 30. Merely due a voltage of around several V, that is for the SBD metal electrode 30 to set the 2DEG layer 18 in an off state, being applied to the drain side of the MOSFET portion 32, even if the MOSFET portion 32 is in an off state, a large electrical field is not applied to the gate insulating film 22 at the end portion of the gate electrode 28, and, on the other hand, a large voltage is applied between the SBD metal electrode 30 and the drain.

On the other hand, when an on signal is inputted to the gate electrode 28, the MOSFET portion 32 enters into a conductive state, and the voltage value at the drain side of the MOSFET portion 32 becomes close to the voltage value of the source electrode 24, and the SBD metal electrode 30 shifts from an off state to an on state, and there becomes a conductive state at the device overall.

Figure 3:
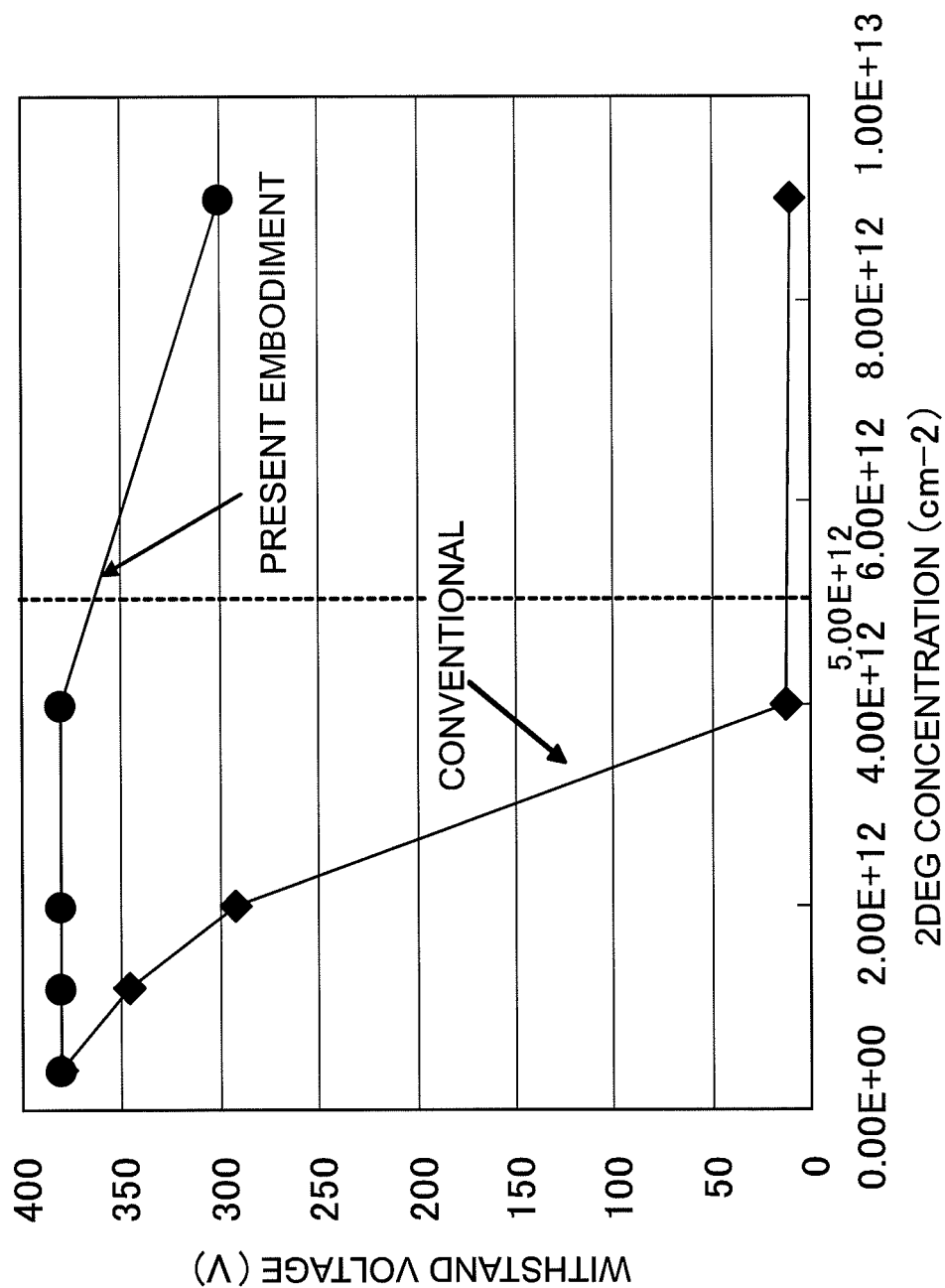
FIG. 3 is an explanatory drawing for explaining the relationship between carrier concentration of a 2DEG, and withstand voltage, of the nitride semiconductor element shown in FIG. 1 and a conventional nitride semiconductor element.
Figure 21:
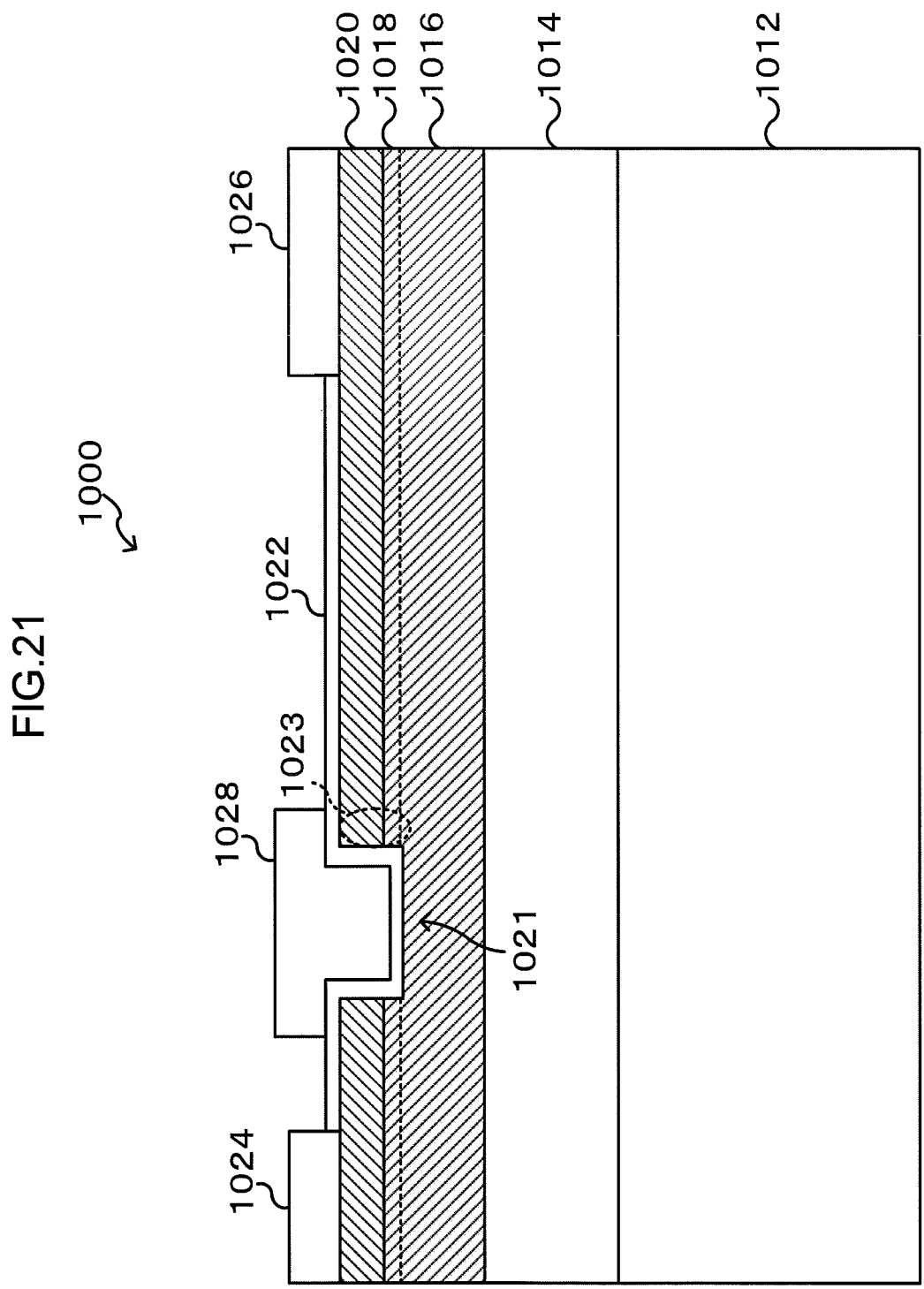
FIG. 21 is a cross-sectional view showing an example of the schematic structure of a conventional nitride semiconductor element.
Figure 22:
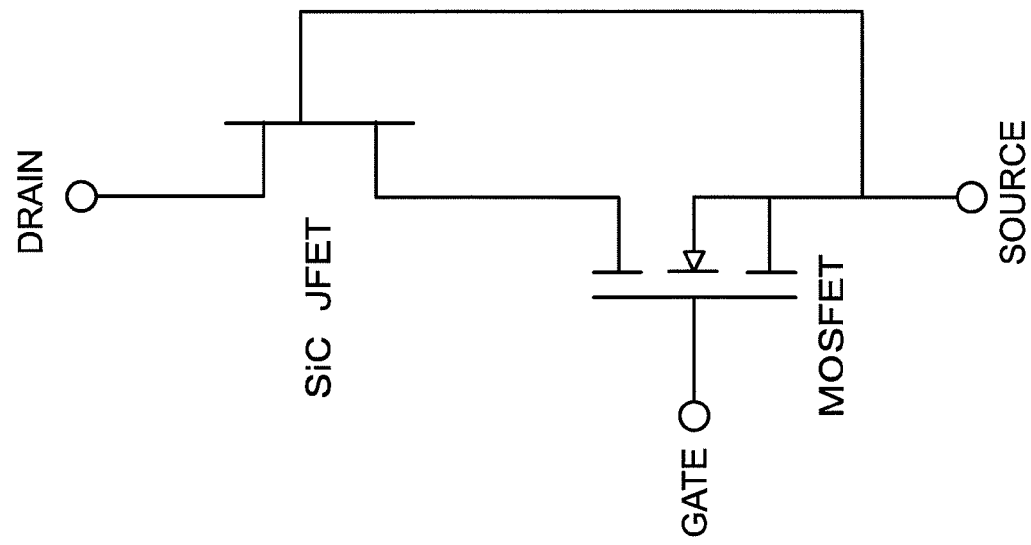
FIG. 22 is a circuit drawing showing an equivalent circuit of a conventional nitride semiconductor element.
Figure 23:
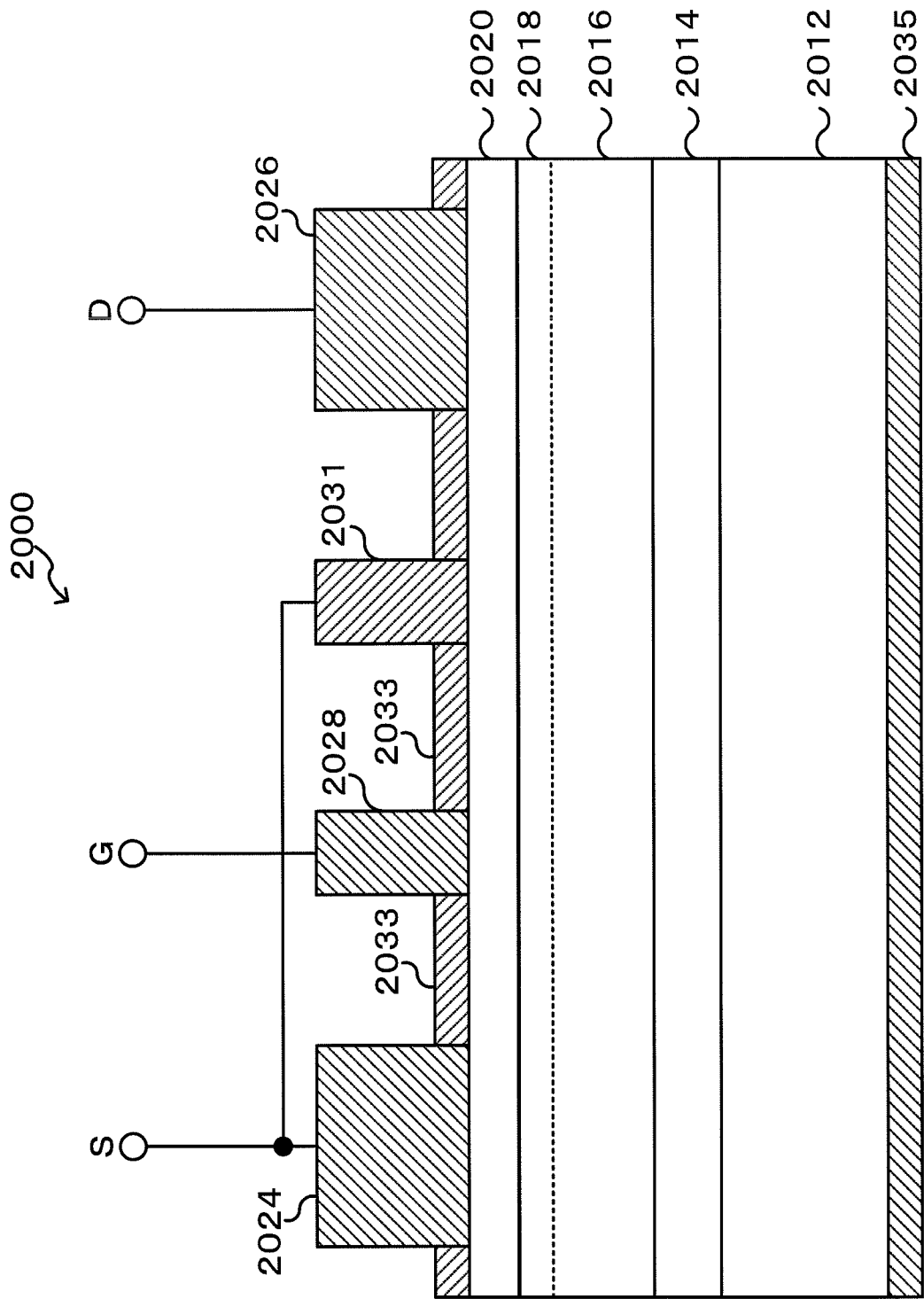
FIG. 23 is a cross-sectional view showing an example of the schematic structure of a conventional nitride semiconductor element.

The relationship between the carrier concentration of the 2DEG and withstand voltage of the nitride semiconductor element 10 of the present embodiment and the conventional nitride semiconductor element 1000 shown in FIG. 21 is shown in FIG. 3. Generally, greater than or equal to $2 \times 10^{12}$ $cm^{-2}$ and less than or equal to $1 \times 10^{13}$ $cm^{-2}$ is used for the carrier concentration of the 2DEG. However, in the conventional nitride semiconductor element 1000 such as shown in FIG. 21, when the carrier concentration of the 2DEG is made to be large at greater than or equal to $2 \times 10^{12}$ $cm^2$, the withstand voltage drops extremely. However, in the nitride semiconductor element 10 of the present embodiment, by adopting the above-described structure, the withstand voltage can be maintained even if the carrier concentration of the 2DEG is made to be large at greater than or equal to $5 \times 10^{12}$ $cm^{-2}$ which is a concentration that is generally preferable. Namely, low on-resistance and high withstand voltage can be realized simultaneously.

Moreover, in the off state, a large voltage is not applied to the drain side of the MOSFET portion 32, and therefore, the gate insulating film 22 can be protected. Further, at the time of the switching operation, when a change over time dv/dt arises in the voltage at the drain electrode 26, the rise in the voltage value of the drain side of the MOSFET portion 32 becomes around 10 V. As compared with a state in which a voltage value (e.g., around 300 to 500 V) that is equivalent to the voltage value applied to the conventional drain electrode 26 is applied, the voltage value of the drain side of the MOSFET portion 32 is small, and therefore, the feedback capacity that is due to the capacity between the gate and the drain can be markedly decreased, and the secondary effect that an even higher-speed switching operation becomes possible is obtained.

Further, in a conventional MOS-type device, generally, in order to mitigate the electrical field at the gate electrode 28 end portion, it was necessary to provide a field plate formed by the gate electrode 28. By providing this field plate, the distance between the gate and the drain becomes close, and therefore, the feedback capacity that is due to the capacity between the gate and the drain further increases, and there were cases in which the switching characteristic was adversely affected. In the nitride semiconductor element 10 of the present invention, the electrical field at the gate electrode 28 end portion is mitigated even without providing such a field plate at the gate electrode 28, and therefore, an increase in the feedback capacity that is due to this field plate can be prevented, and further, the effect of improving the switching characteristic is obtained.

Moreover, in a case in which the nitride semiconductor element 10 is used as an inverter, even in a so-called short circuited state in which the load side short circuits and a large voltage is applied while the nitride semiconductor element 10 remains as is in an on state, the nitride semiconductor element 10 must be able to, to a certain extent, withstand this without being broken. In the conventional nitride semiconductor element 1000 such as shown in FIG. 21, at the time of short circuiting, a large voltage is applied to the drain side of the MOS gate, and hardly any short circuit withstand amount could be anticipated. On the other hand, at the nitride semiconductor element 10 of the present embodiment, even at times of short circuiting, when the MOSFET portion 32 enters into the current mitigating region, voltage is generated between the SBD metal electrode 30 and the drain side of the MOSFET portion 32, and the 2DEG layer 18 is depleted, and therefore, pinches-off and works to limit the current. Due to this operation, excess current flowing, and excess voltage being applied to the drain side of the MOSFET portion 32, can be reduced. Due thereto, the short circuit withstand amount markedly improves over that of the conventional nitride semiconductor element 1000, and the nitride semiconductor element 10 that is difficult to break is obtained.

Still further, as described above, in the conventional nitride semiconductor element 1000 such as shown in FIG. 21, because a built-in diode (FWD) does not exist, when the nitride semiconductor element 1000 is used as an inverter or the like, there are cases in which an FWD must be connected to the exterior. In the nitride semiconductor element 10 of the present embodiment, because a Schottky diode is structured between the SBD metal electrode 30 and the drain side end portion of the MOSFET portion 32, an FWD is built-in, and there is no need to newly connect an FWD to the exterior. Therefore, the entire size can be markedly reduced as compared with conventional structures.

Figure 4:
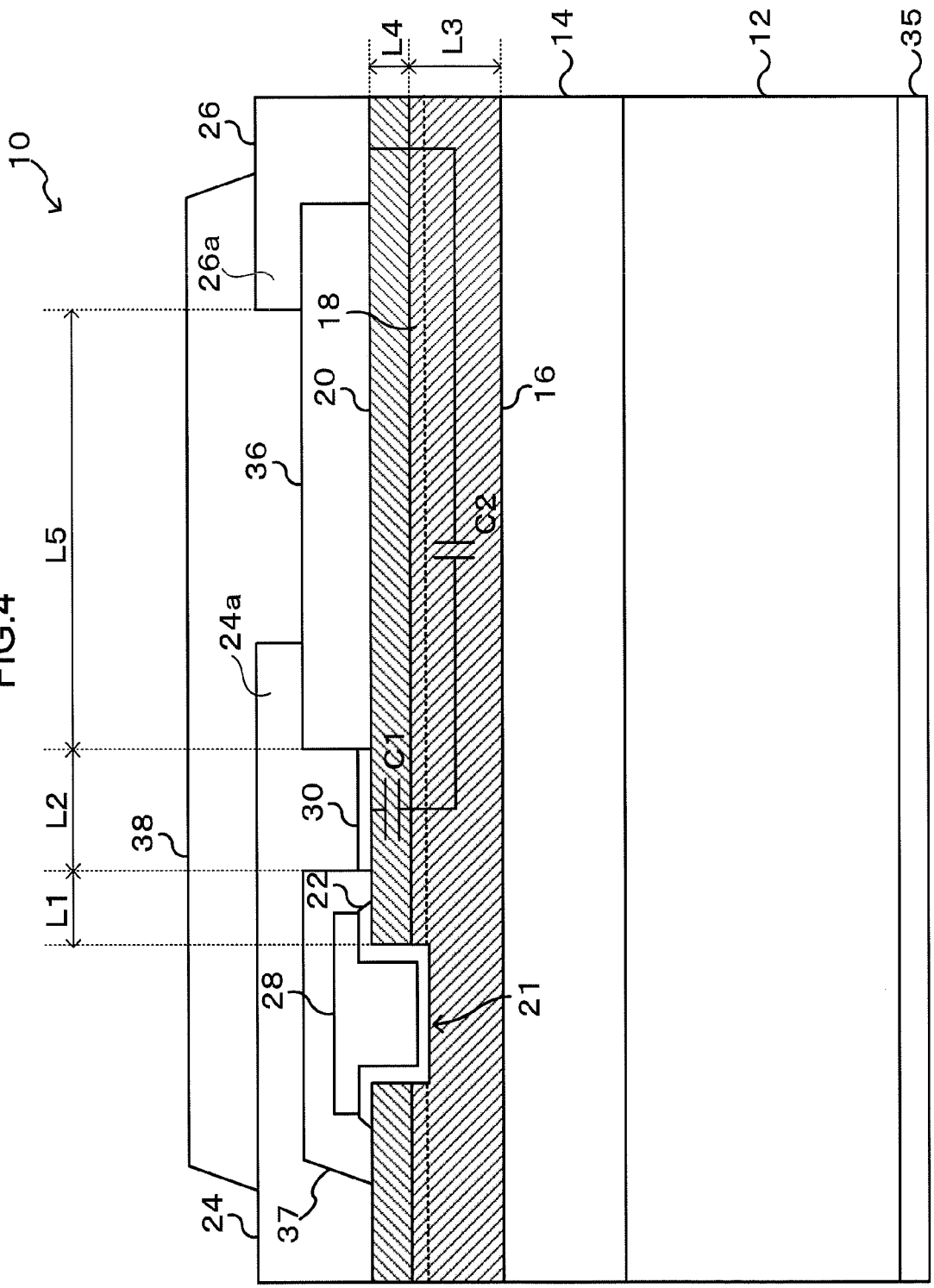
FIG. 4 is a cross-sectional view showing an example of the cross-sectional structure, that is more detailed than the schematic structure shown in FIG. 1, of the nitride semiconductor element relating to the first embodiment of the present invention.

An example of a cross-sectional structure, that is more detailed than the cross-sectional view of the schematic structure shown in FIG. 1 of the nitride semiconductor element 10 of the present embodiment, is shown in FIG. 4.

As shown in FIG. 4, a field insulating film 36 is provided on the surface of the AlGaN layer 20 between the SBD metal electrode 30 and the drain electrode 26, and further, an insulating film 37 is provided so as to cover the surface of the gate electrode 28. An eaves-shaped field plate structure 24a (hereinafter called FP) is structured between the SBD metal electrode 30 and the drain electrode 26 by the source electrode 24 that is for short circuiting with the SBD metal electrode 30, and concentration of an electrical field at the SBD metal electrode 30 end portion is prevented. Further, a similar FP structure 26a is added also at the drain electrode 26.

A surface protecting film 38, that is for keeping debris and effects and the like from the exterior to a minimum, is provided on the surface of the nitride semiconductor element 10 (the surface at the side at which the electrodes such as the gate electrode 28 and the like are formed, the surface corresponding to the upper side in FIG. 4). A reverse surface electrode 35 is formed on the reverse surface of the substrate 12. Usually, there are often cases in which the reverse surface electrode 35 short circuits with the source electrode 24. However, the connection may be changed in accordance with the application or package structure, such as the reverse surface electrode 35 may short circuit with the drain electrode 26, or may not be connected to (may not short circuit with) either, or the like.

Note that, at the nitride semiconductor element 10, surface area for providing the SBD metal electrode 30 on the AlGaN layer 20 is needed. In order to mitigate the size of the device becoming large due thereto and the element resistance increasing due to the distance between the source and the drain becoming long, it is preferable to make lengths L1, L2 that are shown in FIG. 4 be as small as possible. However, because the limitations that are described hereinafter are provided, the lengths L1, L2 are determined by taking these limitations into consideration. Note that the length L1 is the distance from the junction portion of the gate insulating film 22 and the AlGaN layer 20 at the inner side wall of the recess portion 21 to the gate electrode 28 side end portion of the SBD metal electrode 30, and the length L2 is the length of the SBD metal electrode 30 (the length from the gate electrode 28 side end portion to the drain electrode 26 side end portion).

When the nitride semiconductor element 10 is in an off state, the 2DEG is depleted at the region, that is directly beneath the SBD metal electrode 30, of the 2DEG layer 18 of the interface of the AlGaN layer 20/GaN layer 16. This can be modeled as capacities C1, C2 as shown in FIG. 4.

Due thereto, voltage value V1 directly beneath the SBD metal electrode 30 is obtained from following formulas (1) through (3).

$V1 = C2 \times Vds/(C1+C2)$ ($Vds$: voltage between drain and source)    formula (1)

$C1 \propto L2/L4$ ($L4$: layer thickness of AlGaN layer 20)    formula (2)

$C2 \propto L3/L5$ ($L3$: layer thickness of GaN layer 16, $L5$: distance from drain electrode 26 end portion to drain electrode 26 side end portion of SBD metal electrode 30)    formula (3)

For example, as a concrete example, in a case in which L2=1 μm, L3=1 μm, L4=20 nm, and L5=10 μm, V1 is obtained as following formula (4).

$V1 = 0.002 \times Vd$ ($Vd$: drain voltage)    formula (4)

When voltage is applied as Vd=1 kV, V1=2 V. This is description in accordance with a simple model, but, in actuality, due to various factors, the capacities C1, C2 are not expressed by simple formulas such as above formulas (2), (3). When taking the experience of the present inventors and the like into consideration, the voltage V1 in actuality is accompanied by a rise in voltage that is around 5 times that of above formula (4).

Accordingly, in an actual device structure, following formula (5) is established by combining above formulas (2) through (4).

$V1 = 0.1 \times Vd/(L5 \times L2)$ ($L2, L5$ are both in units of μm)    formula (5)

In order to make the voltage V1 be of an extent such that there are no problems even if the voltage V1 is regularly applied to the gate electrode 28, the voltage V1 must satisfy following formula (6).

$$V1 < Emax \times dox \text{ (Emax: maximum electrical field value that may be applied regularly to gate insulating film 22, dox: film thickness of gate insulating film 22)} \quad \text{formula (6)}$$

By combining above formulas (5), (6), the length L2 must satisfy the relationship of following formula (7).

$$L2 > 0.1 \times Vd/(L5 \times Vd \times Emax) \quad \text{formula (7)}$$

The electrical field value Emax is generally around 3 MV/cm when the gate insulating film 22 is SiO2. It is generally known that the electrical field value that is obtained from the voltage Vd and the length L5 is around 100 V/μm, and therefore, above formula (7) is simplified as following formula (8).

$$L2 > 10/(Emax \times dox) \quad \text{formula (8)}$$

For example, when the film thickness dox of the gate insulating film 22 is 60 nm, the length L2 becomes greater than or equal to around 0.6 μm. If the gate insulating film 22 is made to be thinner, it is difficult to make the length L2 shorter. For these reasons, and in consideration of the method of fabricating the actual nitride semiconductor element 10, if the film thickness of the gate insulating film 22 is made to be thick and made to be around 0.1 μM, L2 of around 0.3 μm is obtained as the lower limit value from above formula (8).

Further, persons skilled in the art generally understand that the length L1 is also a factor in determining the withstand voltage between the source and the drain of the MOSFET portion 32. Namely, the voltage value of the drain side end portion of the MOSFET portion 32 becomes substantially the same voltage value as above-described voltage value V1, and therefore, when the length L1 is made to be extremely short, this withstand voltage decreases. When this withstand voltage decreases, if a large voltage is applied to the drain electrode 26, a large voltage of greater than or equal to this withstand voltage is applied to the drain side end portion of the MOSFET portion 32, and the gate insulating film 22 is broken. Accordingly, the length L1 must be set to a length that is such that, even if the above-described voltage V1 is applied, a breakdown does not occur at the region shown by the length L1. Concretely, the length L1 is determined by the withstand voltage of the GaN layer 16. From the experience of the present inventors, the lateral direction withstand voltage of the GaN layer 16 is around 100 V/μm as described above, and therefore, in order to provide a withstand voltage of greater than or equal to 20 V as the voltage V1, L1 must be made to be greater than or equal to 0.2 μm.

Note that the nitride semiconductor element 10 of the above-described present embodiment can be fabricated as follows for example. Note that the fabrication method illustrated hereinafter is an example, and the fabrication method is not limited to this.

Figure 5:
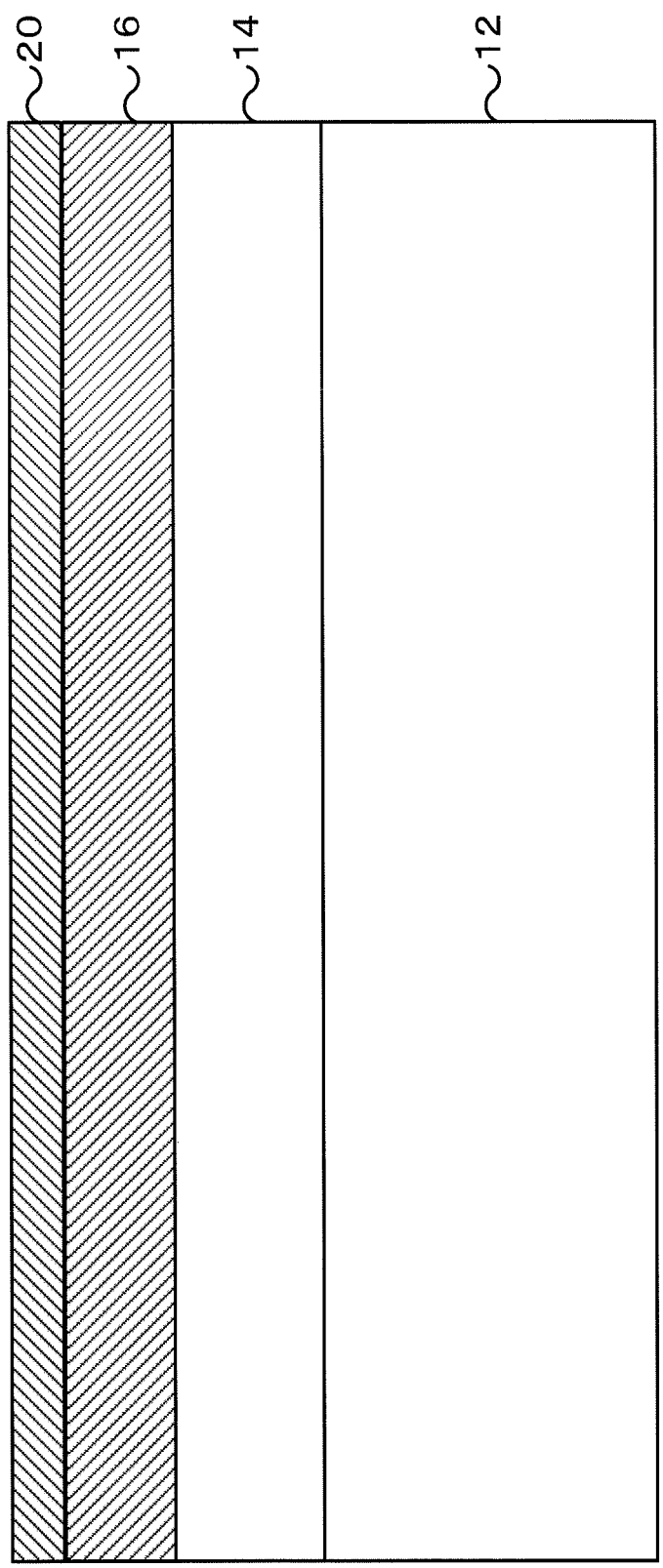
FIG. 5 is an explanatory drawing for explaining one process of an example of a method of fabricating the nitride semiconductor element shown in FIG. 1.

The buffer layer 14 and the GaN layer 16 are successively layered on the substrate 12 by an epitaxial crystal growth method such as an MOCVD method, a Molecular Beam Epitaxial (MBE) method, or the like. Moreover, the AlGaN layer 20 is similarly formed on the GaN layer 16 by an epitaxial growth method (see FIG. 5). Note that the composition and layer thickness of the Al are adjusted at the AlGaN layer 20 in order to control the carrier concentration of the 2DEG.

Figure 6:
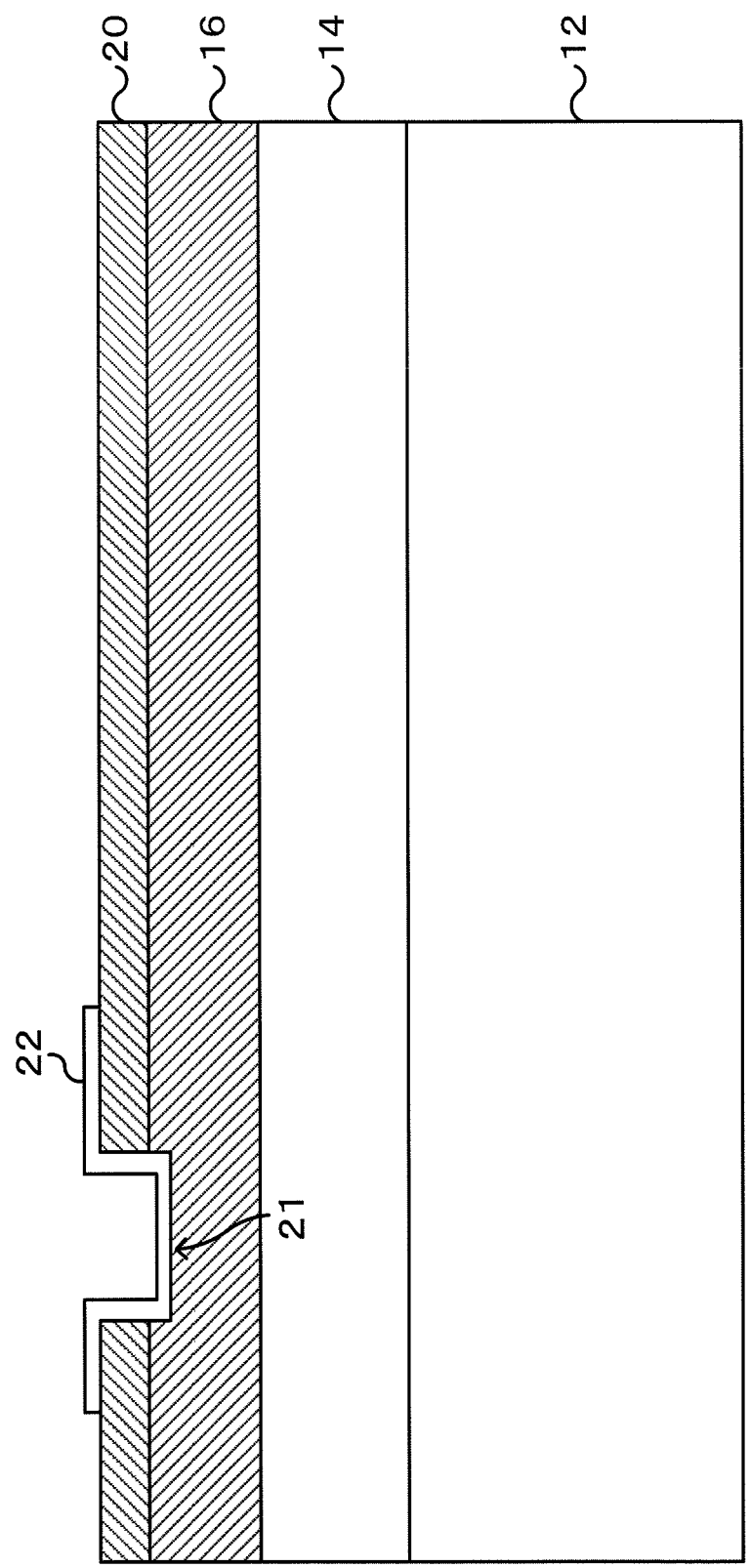
FIG. 6 is an explanatory drawing for explaining one process of the example of a method of fabricating the nitride semiconductor element shown in FIG. 1.

Next, a photoresist is coated on the surface of the AlGaN layer 20, and, by a photolithographic process, patterning is carried out and a predetermined pattern is formed. By using the photoresist as a mask, (portions of) the AlGaN layer 20 and GaN layer 16 at the region where the recess portion 21 is to be formed are removed by etching. Moreover, the gate insulating film 22 that is an $SiO_2$ film or the like is formed on the surface of the element, at the side where the recess portion 21 and the electrodes are formed, by a Chemical Vapor Deposition (CVD) method or the like. Thereafter, by using a photolithographic process, patterning is carried out, and the gate insulating film 22 of the region where the source electrode 24, the drain electrode 26 and the SBD metal electrode 30 are formed and the like, is removed by etching (see FIG. 6).

Moreover, the source electrode 24, the drain electrode 26 and the gate electrode 28 are formed by a sputtering method or a vacuum deposition method or the like. Further, the SBD metal electrode 30 is formed. Moreover, by electrically connecting the source electrode 24 and the SBD metal electrode 30, the nitride semiconductor element 10 of the present embodiment that is shown in FIG. 1 is fabricated.

As described above, in the nitride semiconductor element 10 of the present embodiment that has been obtained as a result of many experiments and analysis of the destruction mechanism by the present inventors, the SBD metal electrode 30, that is provided between the drain electrode 26 and the gate electrode 28, is Schottky joined to the AlGaN layer 20. Further, the SBD metal electrode 30 and the source electrode 24 are connected, and are electrically short circuited. Due thereto, when an off signal is inputted to the gate electrode 28, the MOSFET portion 32 enters into an off state, and the voltage at the drain side of the MOSFET portion 32 becomes close to the voltage value of the drain electrode 26. When the voltage of the drain electrode 26 rises, the voltage value of the SBD metal electrode 30 becomes lower than the voltage value of the drain side of the MOSFET portion 32, and therefore, the drain side of the MOSFET portion 32 and the drain electrode 26 are electrically disconnected by the SBD metal electrode 30.

In this way, in the present embodiment, when an off signal is inputted to the gate electrode 28, the drain side of the MOSFET portion 32 and the drain electrode 26 are electrically disconnected by the SBD metal electrode 30, and the holes, that collect at the drain side end portion of the MOSFET portion 32, are discharged to the source electrode 24. Therefore, even if a large voltage is applied to the drain electrode 26, a large electrical field is not applied to the gate insulating film 22 at the end portion of the gate electrode 28.

Accordingly, the nitride semiconductor element 10, that has high withstand voltage, is high-speed, has low resistance, and is high-performance, and at which destruction of the gate insulating film 22 is prevented and reliability can be improved, is obtained.

Note that, the nitride semiconductor element 10 of the present embodiment uses the AlGaN layer 20 as the electron supplying layer, but is not limited to this, and it suffices for AlGaN to be the main component. Further, there has been described a structure in which the one nitride semiconductor element 10 is formed on the substrate 12, but the nitride semiconductor element 10 of the present embodiment is not limited to this. The plural nitride semiconductor elements 10, that are electrically insulated from one another, may be disposed on the one substrate 12, and may structure an inverter or the like by being wired to one another.

[Second Embodiment]

A nitride semiconductor element of a second embodiment has a structure and operation that are substantially similar to those of the nitride semiconductor element 10 of the first embodiment. Therefore, the same portions are denoted by the same reference numerals and detailed description thereof is omitted, and only the portions that differ are described in detail.

Figure 7:
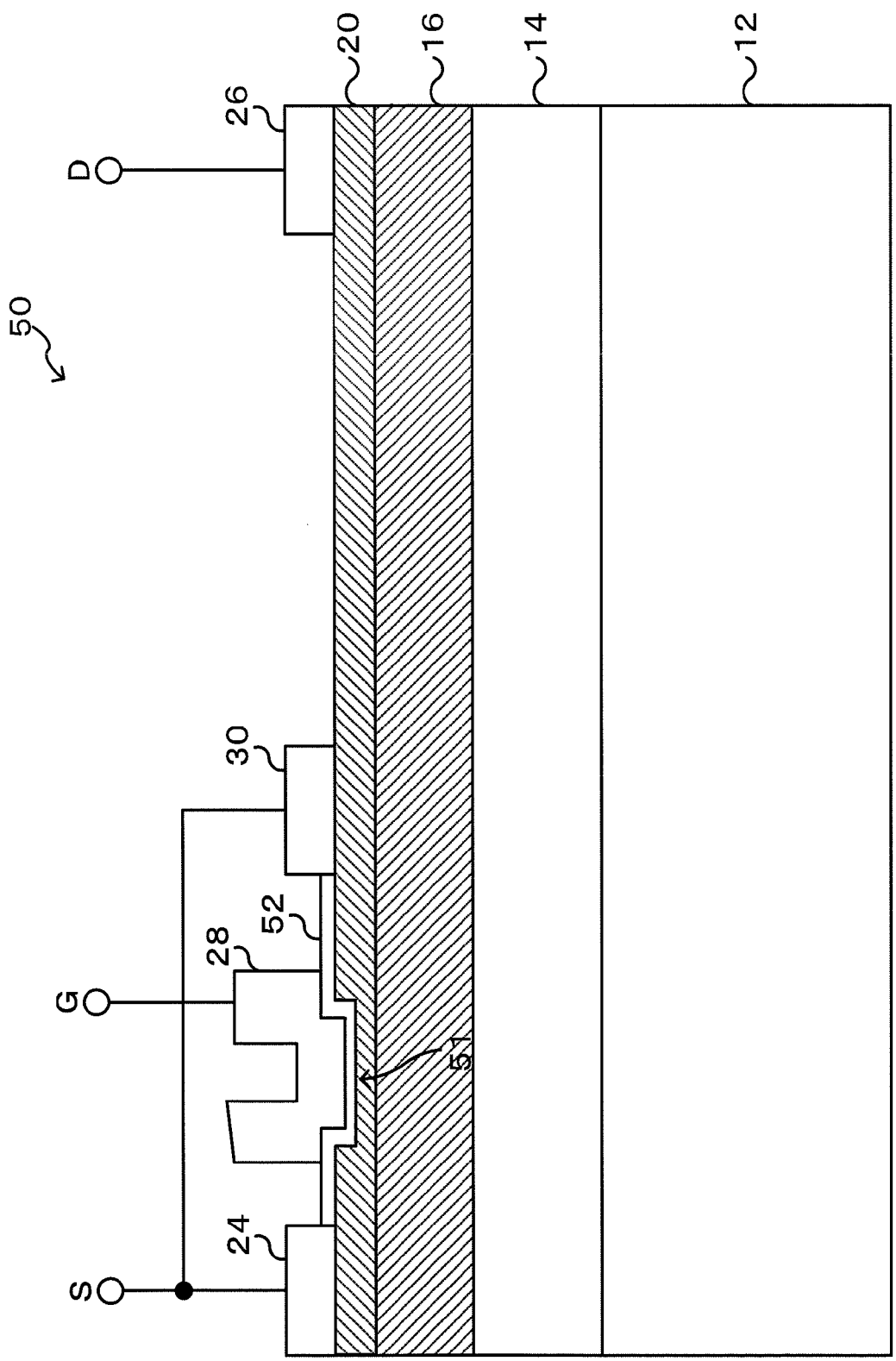
FIG. 7 is a cross-sectional view showing an example of the schematic structure of a nitride semiconductor element relating to a second embodiment of the present invention.

A cross-sectional view, that shows an example of the schematic structure of a nitride semiconductor element that is a nitride semiconductor device of the present embodiment, is shown in FIG. 7. In a nitride semiconductor element 50 of the present embodiment, a recess portion 51 is formed so as to not reach the GaN layer 16, i.e., such that the portion beneath the MOSFET portion 32 is the AlGaN layer 20. Structuring the nitride semiconductor element in this way is preferable in cases in which the threshold value of the MOSFET portion 32 may be made to be low to a certain extent. Note that, in the present embodiment, the AlGaN layer 20 at which the recess portion 51 is formed is sufficiently thin, and therefore, the concentration of the 2DEG that is generated at the surface of the GaN layer 16 is sufficient low, and the nitride semiconductor element 50 operates as a normally-off-type nitride semiconductor device.

In a case in which a gate insulating film 52 is formed on the GaN layer 16 as in the nitride semiconductor element 10 of the first embodiment, the mobility of an inversion layer of electrons that is formed on the surface of the GaN layer 16 decreases due to damage or the like caused by the etching process at the time of forming the recess portion 51. By forming the gate insulating film 52 further toward the upper portion than the interface of the GaN layer 16 and the AlGaN layer 20, a decrease in mobility can be prevented. In this case, because the MOS channel is formed at the GaN layer 16/AlGaN layer 20 interface, the advantage arises that a rise in the resistance of the MOSFET portion 32 is suppressed.

In this way, at the nitride semiconductor element 50 of the present embodiment, because the recess portion 51 is formed within the AlGaN layer 20, a decrease in the mobility of the inversion layer of electrons that is formed at the surface of the GaN layer 16 is prevented, and the effect of being able to suppress a rise in the resistance of the MOSFET portion 32 is further obtained. Accordingly, an inexpensive and high-performance device can be provided.

[Third Embodiment]

A nitride semiconductor element of a third embodiment has a structure and operation that are substantially similar to those of the nitride semiconductor element 10 of the first embodiment and the nitride semiconductor element 50 of the second embodiment. Therefore, the same portions are denoted by the same reference numerals and detailed description thereof is omitted, and only the portions that differ are described in detail.

Figure 8:
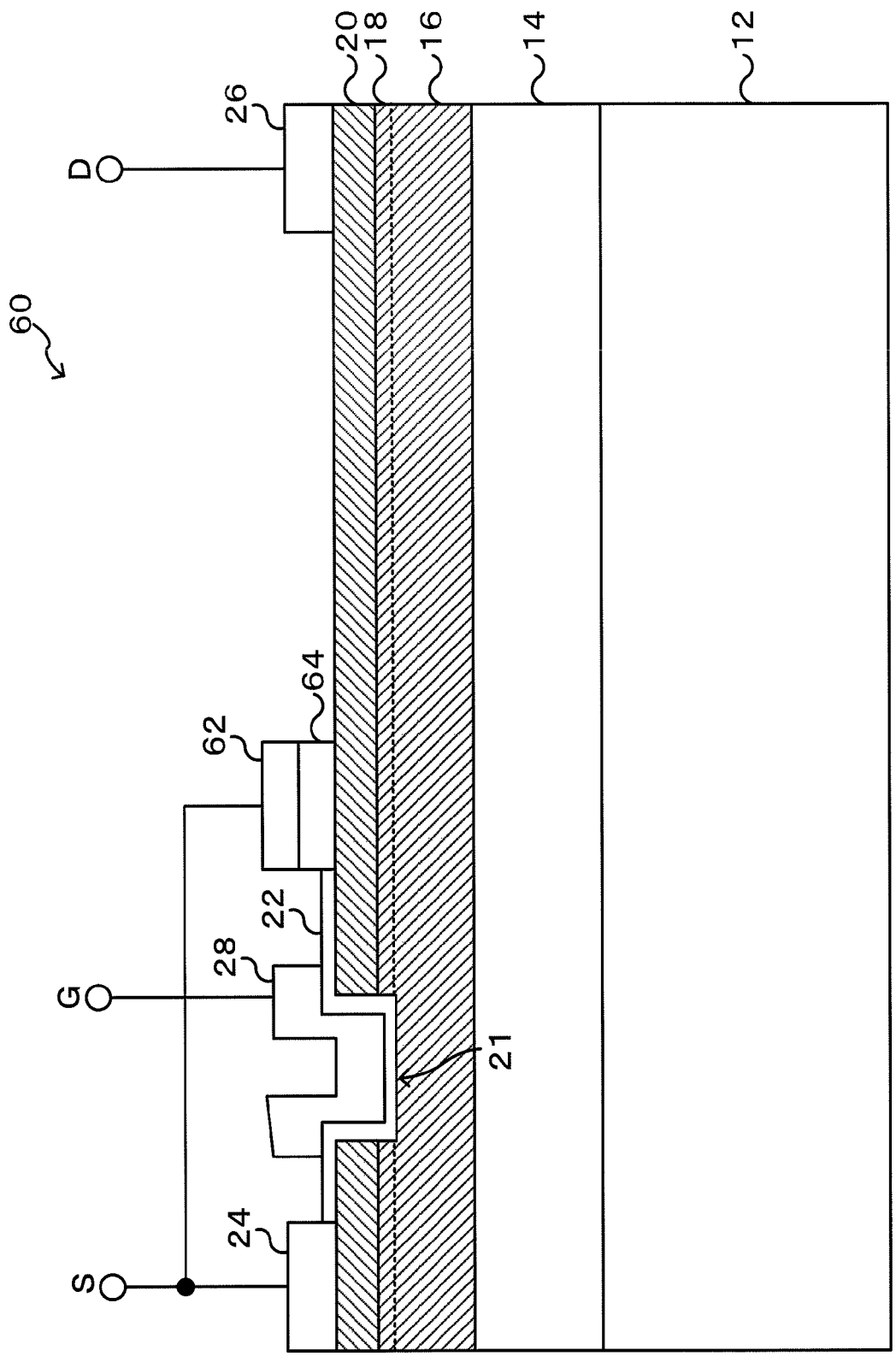
FIG. 8 is a cross-sectional view showing an example of the schematic structure of a nitride semiconductor element relating to a third embodiment of the present invention.

A cross-sectional view, that shows an example of the schematic structure of a nitride semiconductor element that is a nitride semiconductor device of the present embodiment, is shown in FIG. 8. In the nitride semiconductor element 10 of the first embodiment, the SBD metal electrode 30 is provided as an electrode that is Schottky-joined to the AlGaN layer 20. However, in a nitride semiconductor element 60 of the present embodiment, instead of this, a p-AlGaN layer 64 (semiconductor layer) that is pn-joined to the AlGaN layer 20, and an electrode that is ohmically-joined on the p-AlGaN layer 64, are provided.

In the nitride semiconductor element 60 of the present embodiment, the p-AlGaN layer 64 that is pn-joined is provided on the AlGaN layer 20, and further, an ohmic electrode 62 is formed on the p-AlGaN layer 64.

The p-AlGaN layer 64 of the nitride semiconductor element 60 of the present embodiment also has the function of discharging, to the source electrode 24, the holes that collect at the drain side end portion of the MOSFET portion 32, in the same way as the SBD metal electrode 30 of the nitride semiconductor element 10 of the first embodiment. Therefore, similar effects are obtained.

Note that there may be a structure in which the SBD metal electrode 30 shown in the first embodiment and the p-AlGaN layer 64 of the present embodiment are both provided.

[Fourth Embodiment]

A nitride semiconductor element of a fourth embodiment has a structure and operation that are substantially similar to those of the nitride semiconductor elements of the first embodiment through the third embodiment (the nitride semiconductor elements 10, 50, 60). Therefore, the same portions are denoted by the same reference numerals and detailed description thereof is omitted, and only the portions that differ are described in detail.

Figure 9:
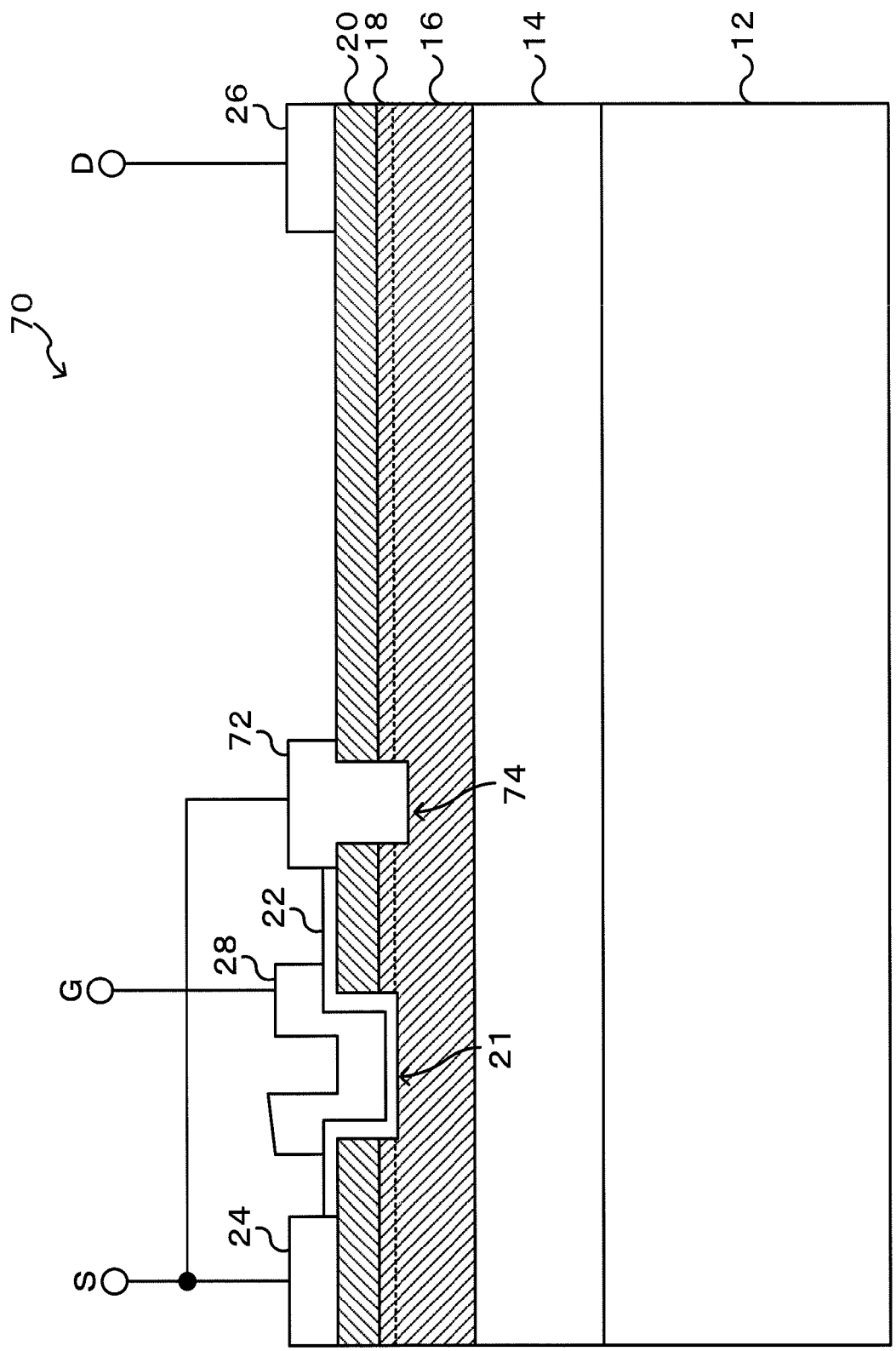
FIG. 9 is a cross-sectional view showing an example of the schematic structure of a nitride semiconductor element relating to a fourth embodiment of the present invention.
Figure 10:
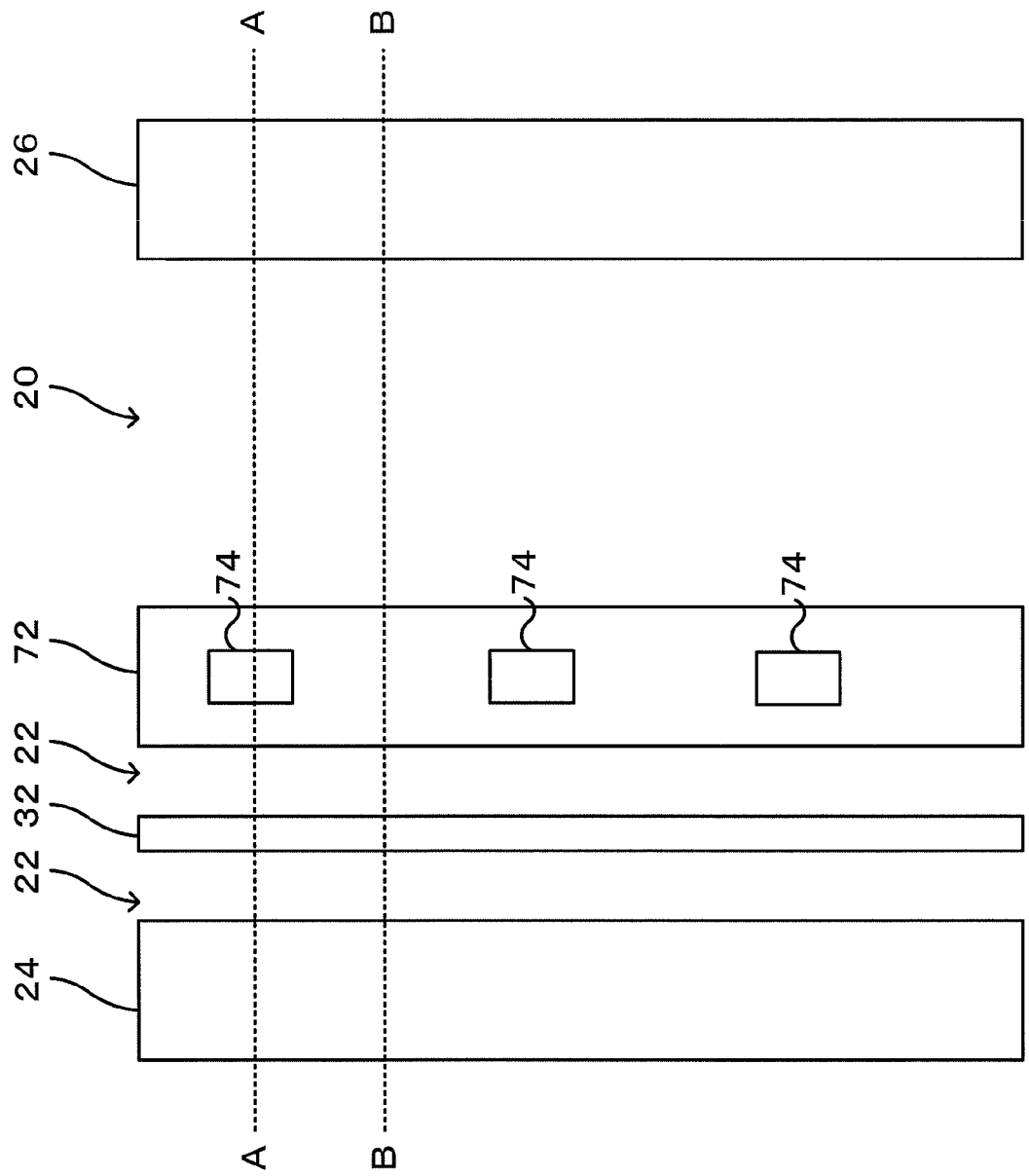
FIG. 10 is a plan view showing an example of the schematic structure when viewing, from the upper side, the nitride semiconductor element shown in FIG. 9.

A cross-sectional view, that shows an example of the schematic structure of a nitride semiconductor element that is a nitride semiconductor device of the present embodiment, is shown in FIG. 9, and further, a plan view as seen from above (the side at which the source electrode 24, the drain electrode 26, and the gate electrode 28 are formed) is shown in FIG. 10. Note that FIG. 9 is the structure at the A-A cross-section in FIG. 10. In a nitride semiconductor element 70 of the present embodiment, an SBD metal electrode 72 that is embedded in the AlGaN layer 20 and the GaN layer 16 is provided instead of the SBD metal electrode 30 that is provided on the AlGaN layer 20 in the nitride semiconductor element 10 of the first embodiment.

In the present embodiment, a recess portion 74 is formed from the surface of the AlGaN layer 20 so as to pass through the AlGaN layer 20 and reach the GaN layer 16. The SBD metal electrode 72 is provided in this recess portion 74. The structure at the B-B cross-section in FIG. 10 is a structure such as shown in FIG. 1. Note that, as shown in FIG. 10, the recess portion 74 is provided in parts.

By providing the SBD metal electrode 72 within the recess portion 74 in this way, the holes that accumulate at the MOSFET portion 32 interface can be discharged to the source electrode 24 more efficiently.

Note that the depth of the recess portion 74 may be at least to the interior of the AlGaN layer 20, but preferably reaches the GaN layer 16 such as shown in FIG. 9, and the SBD metal electrode 72 contacting the portion at which the 2 DEG is generated (the 2DEG layer 18) is preferable in particular.

[Fifth Embodiment]

A nitride semiconductor element of a fifth embodiment has a structure and operation that are substantially similar to those of the nitride semiconductor elements of the first embodiment through the fourth embodiment (the nitride semiconductor elements 10, 50, 60, 70). Therefore, the same portions are denoted by the same reference numerals and detailed description thereof is omitted, and only the portions that differ are described in detail.

Figure 11:
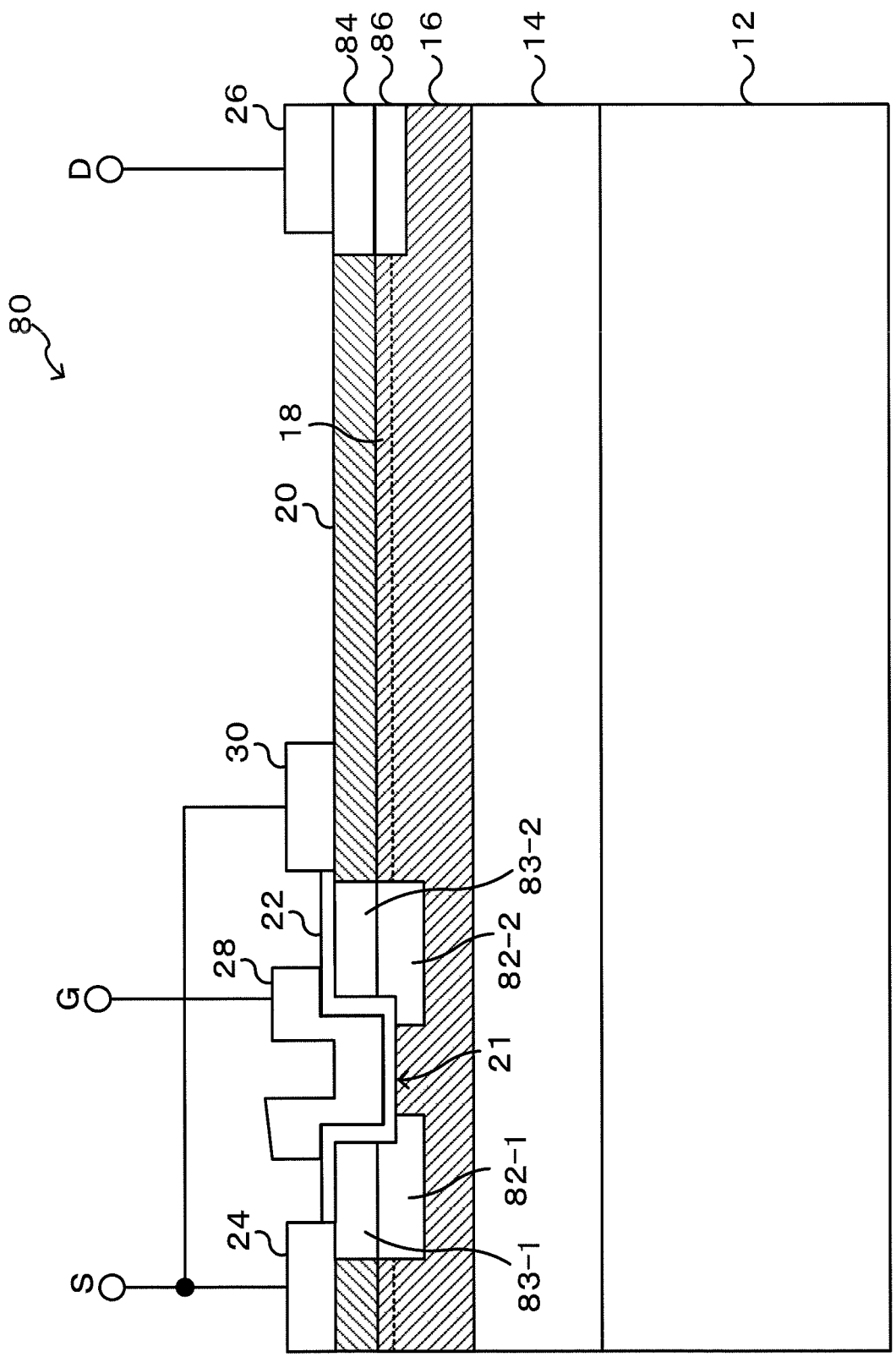
FIG. 11 is a cross-sectional view showing an example of the schematic structure of a nitride semiconductor element relating to a fifth embodiment of the present invention.

A cross-sectional view, that shows an example of the schematic structure of a nitride semiconductor element that is a nitride semiconductor device of the present embodiment, is shown in FIG. 11. In a nitride semiconductor element 80 of the present embodiment, an n+ AlGaN layer 83-1 and an n+ GaN layer 82-1 at the source electrode 24 side and an n+ AlGaN layer 83-2 and an n+ GaN layer 82-2 at the SBD metal electrode 30 side, that become a first n+ region, are provided at the region beneath the gate insulating film 22, and an n+ AlGaN layer 84 and an n+ GaN layer 86, that become a second n+ region, are provided beneath the drain electrode 26.

The n+ AlGaN layer 83-1, that is the n+ region at the region beneath the gate insulating film 22 between the source electrode 24 and the gate electrode 28, is joined to the source electrode 24. Further, the n+ GaN layer 82-2 and the n+ AlGaN layer 83-2, that are the n+ region of the region beneath the gate insulating film 22 between the gate electrode 28 and the SBD metal electrode 30, are not connected to the SBD metal electrode 30.

The n+ regions of the present embodiment (the n+ GaN layers 82-1, 82-2 and the n+AlGaN layers 83-1, 83-2) are formed by, after formation of the AlGaN layer 20, Si being ion-injected at around $10^{15}$ cm$^{-2}$ at the applicable places, and thereafter, carrying out a heat treatment at around 1000° C., and, due thereto, the AlGaN layer 20 being changed into the n+AlGaN layers 83-1, 83-2 and the GaN layer 16 being changed into the n+ GaN layers 82-1, 82-2.

By providing n+ regions at regions beneath the gate insulating film 22 in this way, the side wall portions of the gate insulating film 22 (the side wall portions of the recess portion 21) become channel regions. Therefore, the resistance components that flow by being transmitted through these side wall portions can be removed, and the resistance of the entire nitride semiconductor element 80 can be made to be small.

Further, in the nitride semiconductor element 80 of the present embodiment, the AlGaN layer 20 at the region beneath the drain electrode 26 changes into the n+ AlGaN layer 84, and the GaN layer 16 changes into the n+ GaN layer 86. Due thereto, the ohmic resistance of the drain electrode 26 can be made to be small, and leak current can be reduced.

[Sixth Embodiment]

A nitride semiconductor element of a sixth embodiment has a structure and operation that are substantially similar to those of the nitride semiconductor elements of the first embodiment through the fifth embodiment (the nitride semiconductor elements 10, 50, 60, 70, 80). Therefore, the same portions are denoted by the same reference numerals and detailed description thereof is omitted, and only the portions that differ are described in detail.

Figure 12:
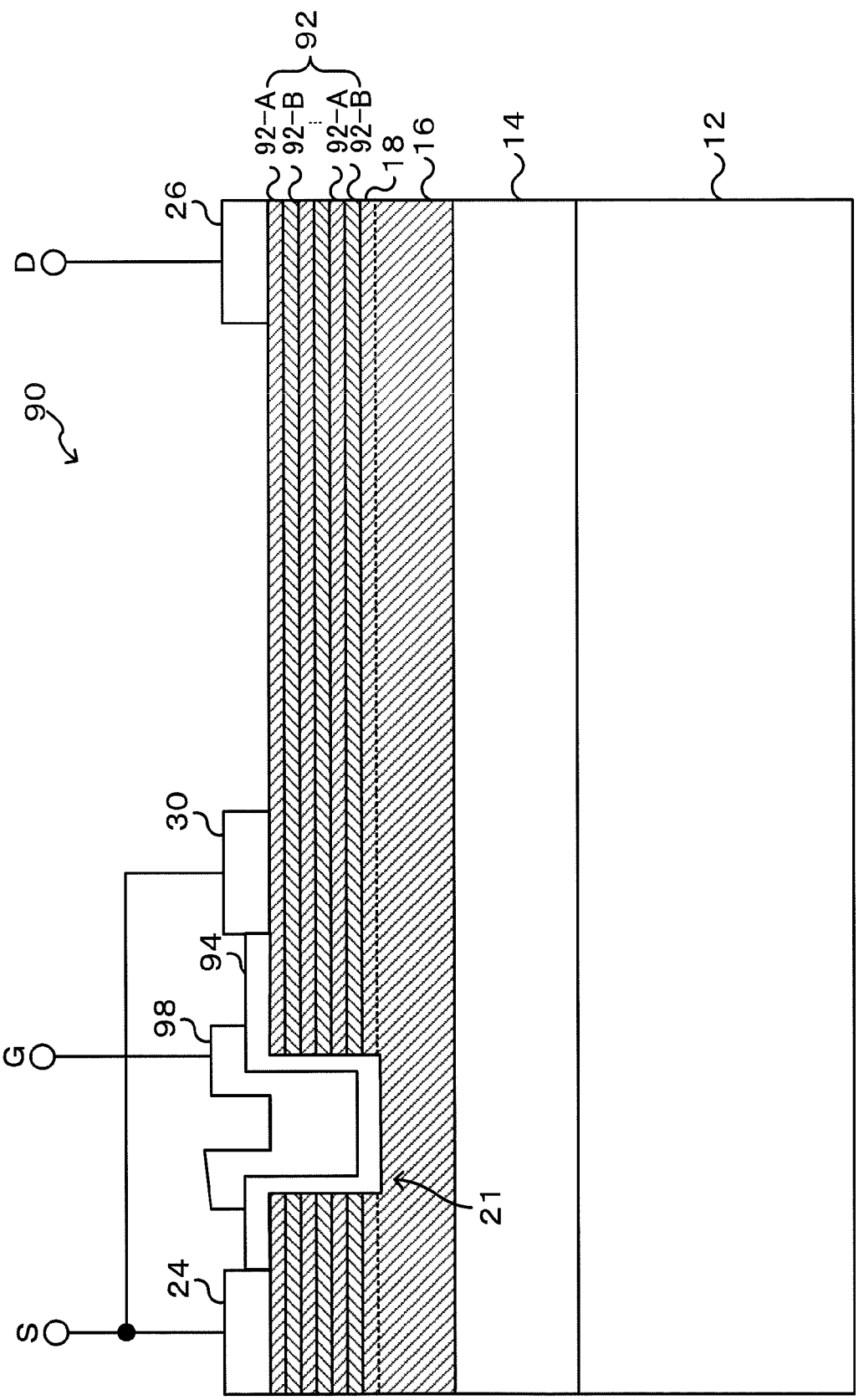
FIG. 12 is a cross-sectional view showing an example of the schematic structure of a nitride semiconductor element relating to a sixth embodiment of the present invention.

A cross-sectional view, that shows an example of the schematic structure of a nitride semiconductor element that is a nitride semiconductor device of the present embodiment, is shown in FIG. 12. In a nitride semiconductor element 90 of the present embodiment, an electron supplying layer 92, in which GaN layers 92-A and AlN layers 92-B are layered repeatedly, is provided instead of the AlGaN layer 20 of the first through fifth embodiments.

FIG. 12 shows a case in which, at the electron supplying layer 92, the GaN layers 92-A and the MN layers 92-B are repeatedly layered three times. By making the electron supplying layer 92 be a layered structure in which the GaN layers 92-A and the MN layers 92-B are layered repeatedly in this way, the carrier concentration of the 2DEG layer 18 can be made to be a high concentration, e.g., a concentration exceeding $1\times10^{13}$ cm$^{-2}$, and the nitride semiconductor element 90 can be made to be low resistance.

Figure 13:
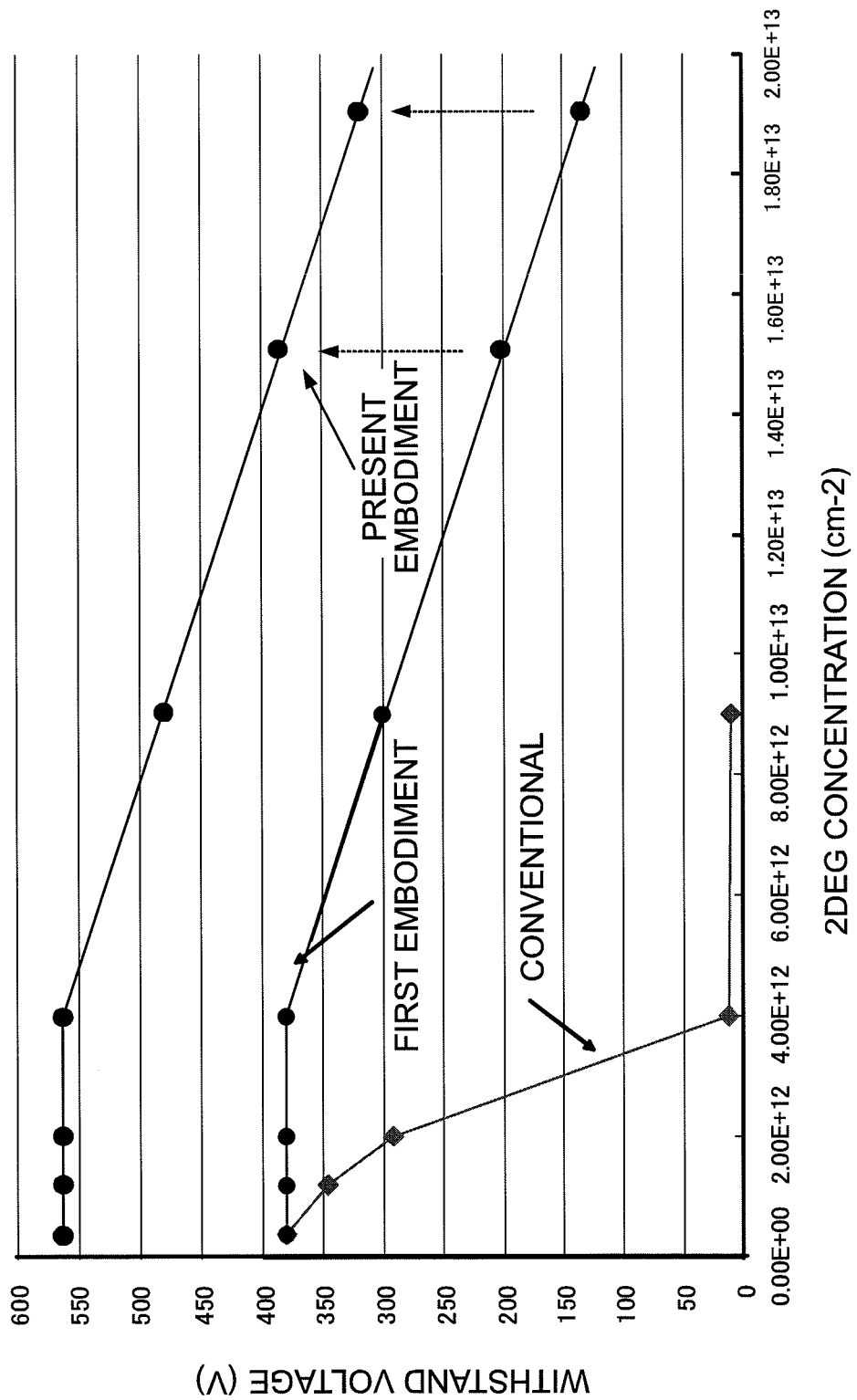
FIG. 13 is an explanatory drawing for explaining the relationship between carrier concentration of a 2DEG, and withstand voltage, of the nitride semiconductor element of the sixth embodiment of the present invention, the nitride semiconductor element of the first embodiment, and the conventional nitride semiconductor element.

By the way, the first embodiment describes that the nitride semiconductor element 10 of the first embodiment is used with the carrier concentration of the 2DEG being greater than or equal to $2\times10^{12}$ cm$^{-2}$ and less than or equal to $1\times10^{13}$ cm$^{-2}$. However, this is because there are cases in which the decrease in the withstand voltage becomes problematic when the carrier concentration is in a range exceeding $1\times10^{13}$ cm$^{-2}$. FIG. 13 shows the relationship between the carrier concentration of the 2DEG and the withstand voltage, of the nitride semiconductor element 90 of the present embodiment, the nitride semiconductor element 10 of the first embodiment, and the conventional nitride semiconductor element 1000 shown in FIG. 21.

Generally, the withstand voltage of a nitride semiconductor element depends on the G-D (gate-drain) distance, and, the greater the G-D distance, the greater the withstand voltage. Therefore, if the carrier concentration exceeds $1\times10^{13}$ cm$^{-2}$, problems due to a decrease in the withstand voltage can be solved by making the G-D distance large. Therefore, in the nitride semiconductor element 90 of the present embodiment, the G-D distance is made to be larger than that of the nitride semiconductor element 10 of the first embodiment.

As shown in FIG. 13, at the nitride semiconductor element 90 of the present embodiment, because the withstand voltage is improved, a withstand voltage that is sufficient in practical use can be obtained even when the carrier concentration is in a range exceeding $1\times10^{13}$ cm$^{-2}$ (preferably less than or equal to $2\times10^{13}$ cm$^{-2}$), that is a range in which the withstand voltage tends to decrease.

Note that, in the present embodiment, as described above, a case is illustrated in which the electron supplying layer 92 is a layered structure (see FIG. 12) in which the GaN layers 92-A and the AlN layers 92-B are repeatedly layered three times. However, the number of times of layering, the composition ratio of Al at the entire electron supplying layer 92, the film thickness of the electron supplying layer 92, and the like are not limited to this.

Figure 14:
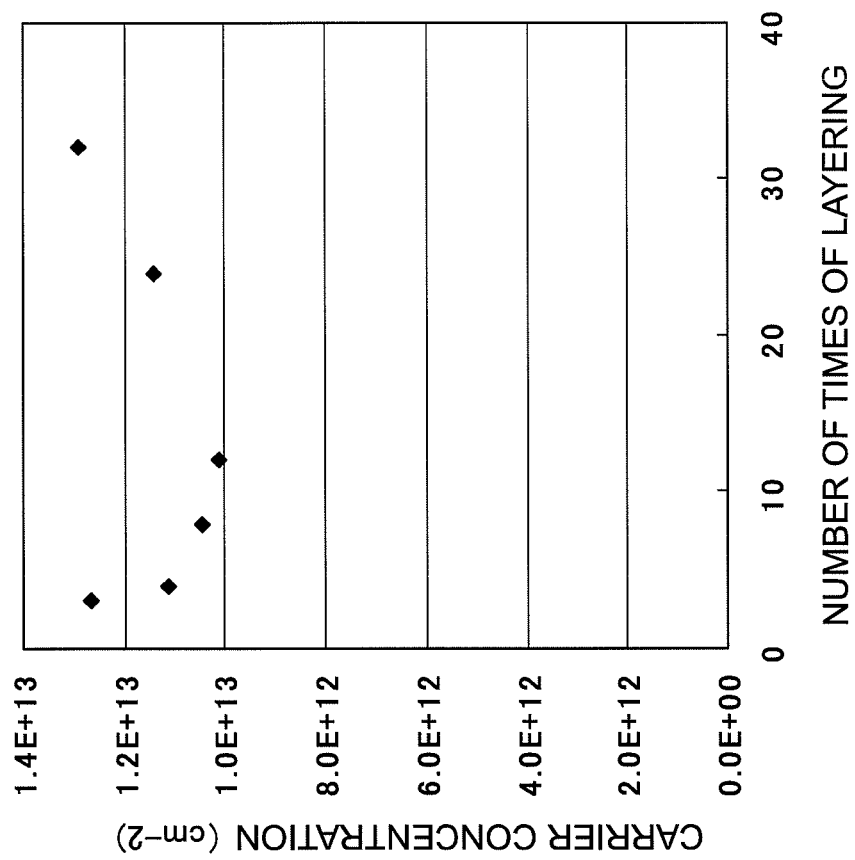
FIG. 14 is an explanatory drawing for explaining the relationship between number of times of layering and carrier concentration, in the nitride semiconductor element of the sixth embodiment of the present invention.

FIG. 14 shows the relationship between the number of times of layering and the carrier concentration at the nitride semiconductor element 90 of the present embodiment. Note that, here, the film thickness and the composition ratio of Al of the entire electron supplying layer 92 are substantially the same regardless of the number of times of layering. As a concrete example, in a case in which the number of times of layering is three times, the GaN layer 92-A is 6.20 nm, the AlN layer 92-B is 2.10 nm, the electron supplying layer 92 is 24.9 nm, and the AlN film thickness ratio is 0.253.

As shown in FIG. 14, at the nitride semiconductor element 90 of the present embodiment, a high carrier concentration is obtained in all cases regardless of the number of times of layering, but the carrier concentration differs in accordance with the number of times of layering.

Figure 15:
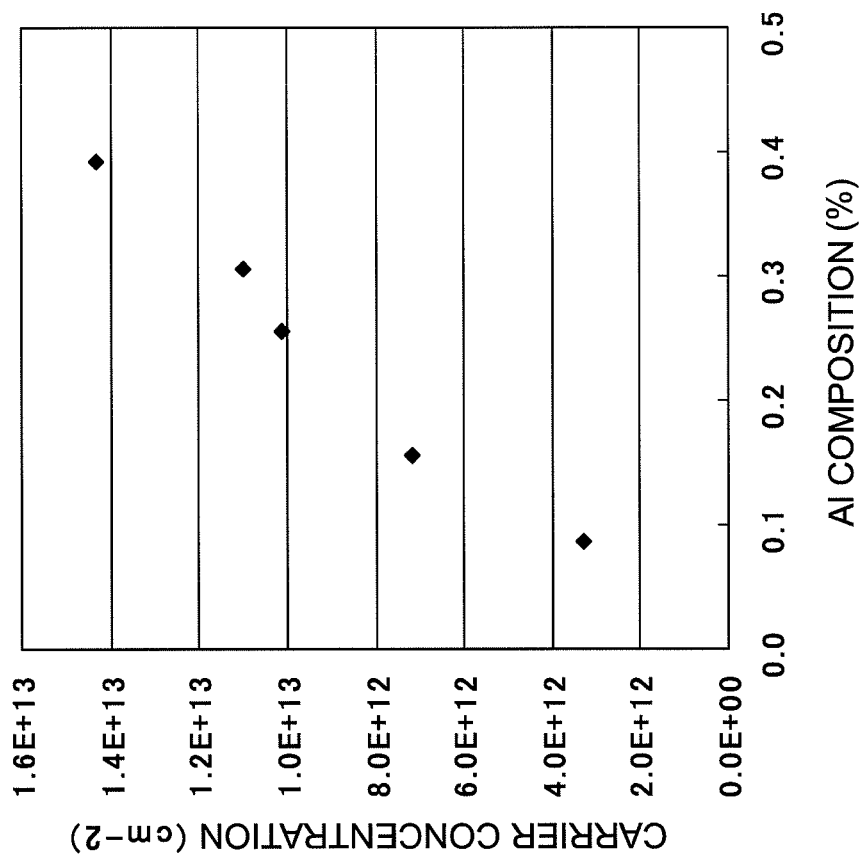
FIG. 15 is an explanatory drawing for explaining the relationship between the Al composition ratio of an entire electron supplying layer, and carrier concentration, in the nitride semiconductor element of the sixth embodiment of the present invention.

Further, FIG. 15 shows the relationship between the composition ratio of Al and the carrier concentration of the entire electron supplying layer 92 at the nitride semiconductor element 90 of the present embodiment. Note that, here, the film thickness and the composition ratio of Al of the entire electron supplying layer 92 are substantially the same, and further, the film thickness of the AlN layer 92-B is the same at 0.55 nm, and the film thickness of the GaN layer 92-A and the number of times of repeating are varied.

As shown in FIG. 15, the carrier concentration also increases in accordance with the composition ratio of Al of the entire electron supplying layer 92 increasing.

Figure 16:
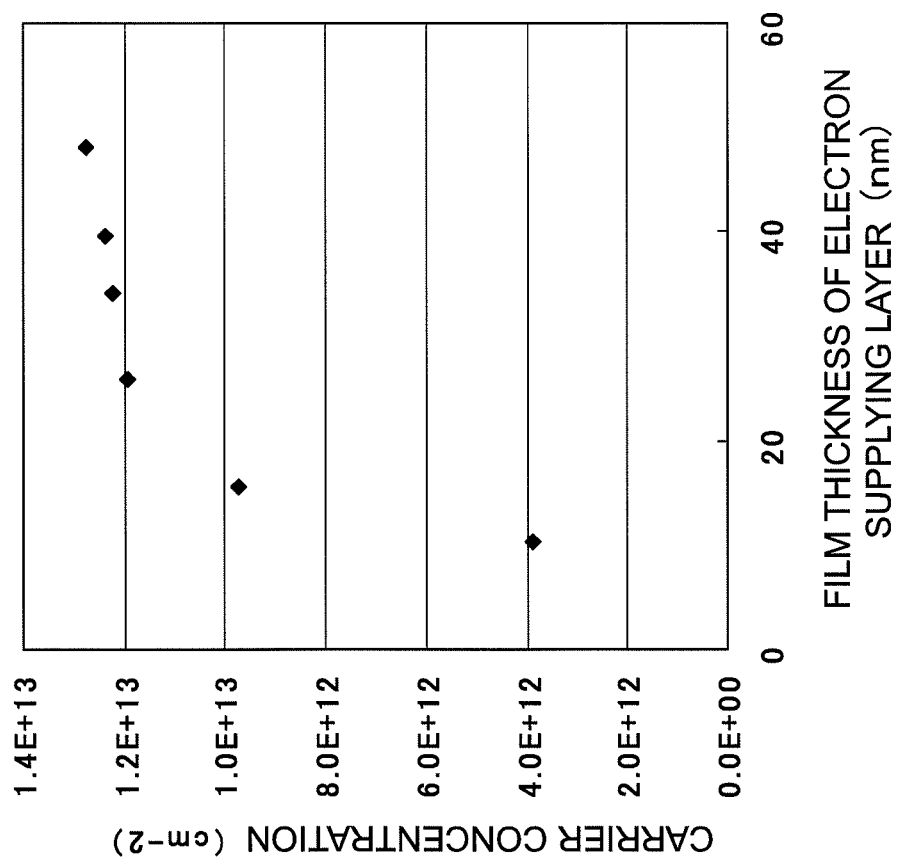
FIG. 16 is an explanatory drawing for explaining the relationship between film thickness of the electron supplying layer, and carrier concentration, in the nitride semiconductor element of the sixth embodiment of the present invention.

Further, FIG. 16 shows the relationship between the film thickness and the carrier concentration of the electron supplying layer 92 at the nitride semiconductor element 90 of the present embodiment. Note that, here, the composition ratio of Al of the entire electron supplying layer 92 is substantially the same, and the number of times of repeating is 12 times. By varying the film thicknesses of the GaN layer 92-A and the AlN layer 92-B, the film thickness of the entire electron supplying layer 92 is changed.

As shown in FIG. 16, the carrier concentration also increases in accordance with the film thickness of the entire electron supplying layer 92 increasing.

In this way, at the nitride semiconductor element 90, the carrier concentration differs in accordance with the number of times of layering, the composition ratio of Al at the entire electron supplying layer 92, the film thickness of the electron supplying layer 92, and the like. Therefore, it suffices to determine these in accordance with the desired carrier concentration, characteristic of the nitride semiconductor element 90, and the like.

Further, in the present embodiment, the electron supplying layer 92 is structured by two types of layers (the GaN layer 92-A and the AlN layer 92-B), but is not limited to this, and may be structured by three or more types of layers.

[Seventh Embodiment]

A nitride semiconductor element of a seventh embodiment has a structure and operation that are substantially similar to those of the nitride semiconductor elements of the first embodiment through the sixth embodiment (the nitride semiconductor elements 10, 50, 60, 70, 80, 90). Therefore, the same portions are denoted by the same reference numerals and detailed description thereof is omitted, and only the portions that differ are described in detail.

Figure 17:
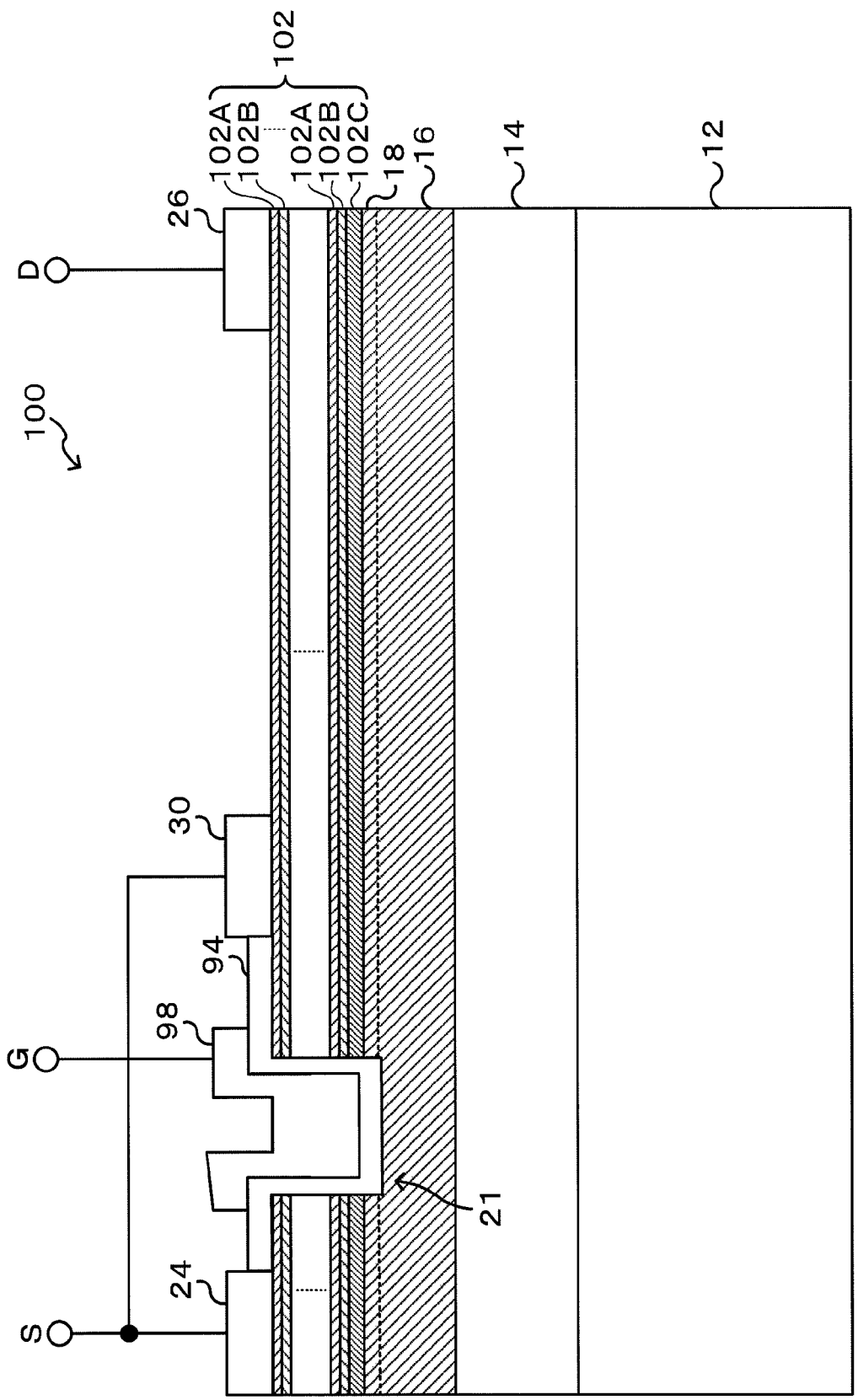
FIG. 17 is a cross-sectional view showing an example of the schematic structure of a nitride semiconductor element relating to a seventh embodiment of the present invention.

A cross-sectional view, that shows an example of the schematic structure of a nitride semiconductor element that is a nitride semiconductor device of the present embodiment, is shown in FIG. 17. In a nitride semiconductor element 100 of the present embodiment, an electron supplying layer 102 is provided with an AlN layer 102-C at the side that contacts the GaN layer 16.

In the nitride semiconductor element 100 of the present embodiment that is shown in FIG. 17, as a concrete example, the electron supplying layer 102 is structured from a layered structure in which a GaN layer 102-A of a film thickness of 1.60 nm and an AlN layer 102-B of a film thickness of 0.55 nm are repeatedly layered 12 times, and the AlN layer 102-C.

Figure 18:
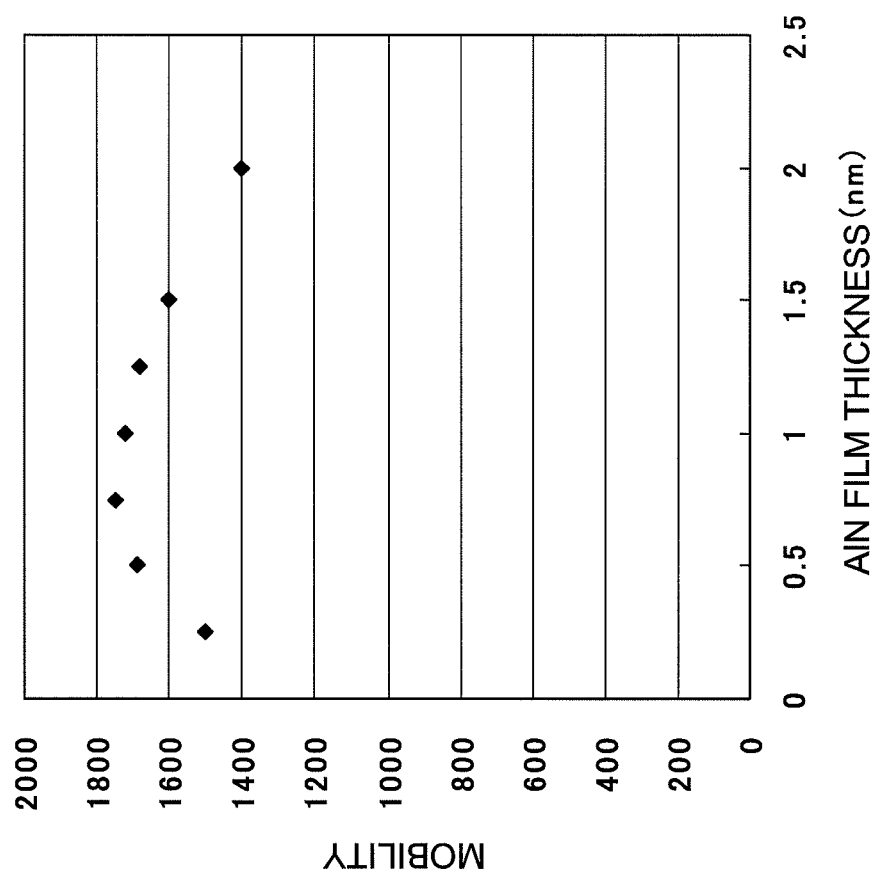
FIG. 18 is an explanatory drawing for explaining the relationship between film thickness of an AlN layer, and carrier mobility, in the nitride semiconductor element relating to the seventh embodiment of the present invention.

Due to the electron supplying layer 102 being provided with the AlN layer 102-C in this way, the mobility of the carrier can be improved. FIG. 18 shows the relationship between the film thickness of the AlN layer 102-C and the carrier mobility at the nitride semiconductor element 100 of the present embodiment. As shown in FIG. 18, because the carrier mobility varies in accordance with the film thickness of the AlN layer 102-C, the film thickness of the AlN layer 102-C is preferably around 0.5 to 1.5 nm, and around 1 nm is more preferable.

Note that, in the present embodiment, the electron supplying layer 102 is structured so as to have the AlN layer 102-C between the GaN layer 16 and the layered structure formed from the GaN layers 102-A and the AlN layers 102-B, but is not limited to this, and, for example, may be structured so as to have the AlN layer 102-C between the GaN layer 16 and an AlGaN layer (the AlGaN layer 20) that is a single electron supplying layer as in the first through fifth embodiments.

[Eighth Embodiment]

A nitride semiconductor element of an eighth embodiment has a structure and operation that are substantially similar to those of the nitride semiconductor elements of the first embodiment through the seventh embodiment (the nitride semiconductor elements 10, 50, 60, 70, 80, 90, 100). Therefore, the same portions are denoted by the same reference numerals and detailed description thereof is omitted, and only the portions that differ are described in detail.

Figure 19:
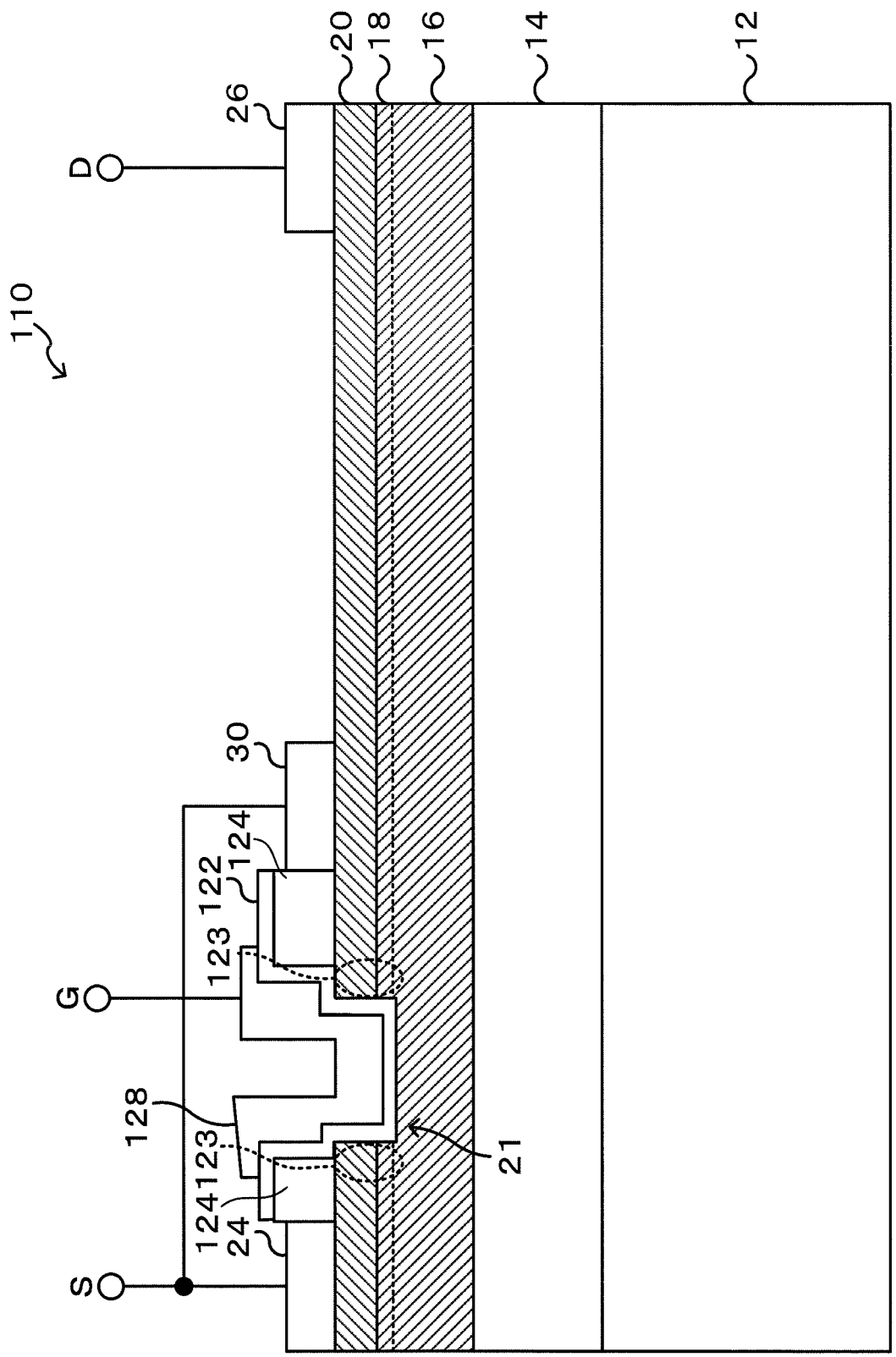
FIG. 19 is a cross-sectional view showing an example of the schematic structure of a nitride semiconductor element relating to an eighth embodiment of the present invention.

A cross-sectional view, that shows an example of the schematic structure of a nitride semiconductor element that is a nitride semiconductor device of the present embodiment, is shown in FIG. 19. In a nitride semiconductor element 120 of the present embodiment, a field mitigating layer 124 is provided at the region between the electron supplying layer 20 and a gate insulating film 122, other than at the periphery of the recess portion 21.

The first embodiment describes that an increase in the feedback capacity can be prevented without the need for providing a field plate, that is such that the distance between the gate and the drain becomes closer, in order to mitigate the electrical field at the gate electrode 28 end portion. In the nitride semiconductor element 10 of the first embodiment, there is a structure in which, when the MOSFET portion 32 is off, a high voltage is not applied to the gate insulating film 22, and therefore, in this way, there is no need to provide a field plate. However, when the MOSFET portion 32 is on, a high voltage is applied to the gate insulating film 22, and therefore, there are cases in which a structure for mitigating the electrical field (a field mitigating structure) is needed at the gate electrode 28 end portion.

Thus, in the nitride semiconductor element 110 of the present embodiment, as this field mitigating structure, the field mitigating layer 124 is provided at the region between the electron supplying layer 20 and the gate insulating film 122, other than at the periphery of the recess portion 21.

By providing the field mitigating layer 124, the gate insulating film 122 is formed so as to have a multi-step (in the present embodiment, a two-step) structure that is bent at the surface of the electron supplying layer 20 and the surface of the field mitigating layer 124. In this way, at the gate insulating film 122, a step that corresponds to the film thickness of the field mitigating layer 124 arises due to the field mitigating layer 124, and the electrical field that concentrates at an end portion 123 of the gate electrode is dispersed at this step portion. Therefore, the electrical field that concentrates at the end portion 123 of the gate electrode can be mitigated.

$SiO_2$ or SiN or a composite film thereof or the like can be used as the field mitigating layer 124, and an $SiO_2$ film is preferably used. Further, because the electrical field is mitigated in accordance with the film thickness of the field mitigating layer 124, this film thickness is determined in accordance with the voltage value that is applied to the gate insulating film 122 when on, or the like, and 0.05 to 0.5 um is preferable.

[Ninth Embodiment]

A nitride semiconductor element of a ninth embodiment has a structure and operation that are substantially similar to those of the nitride semiconductor elements of the first embodiment through the eighth embodiment (the nitride semiconductor elements 10, 50, 60, 70, 80, 90, 100, 110). Therefore, the same portions are denoted by the same reference numerals and detailed description thereof is omitted, and only the portions that differ are described in detail.

Figure 20:
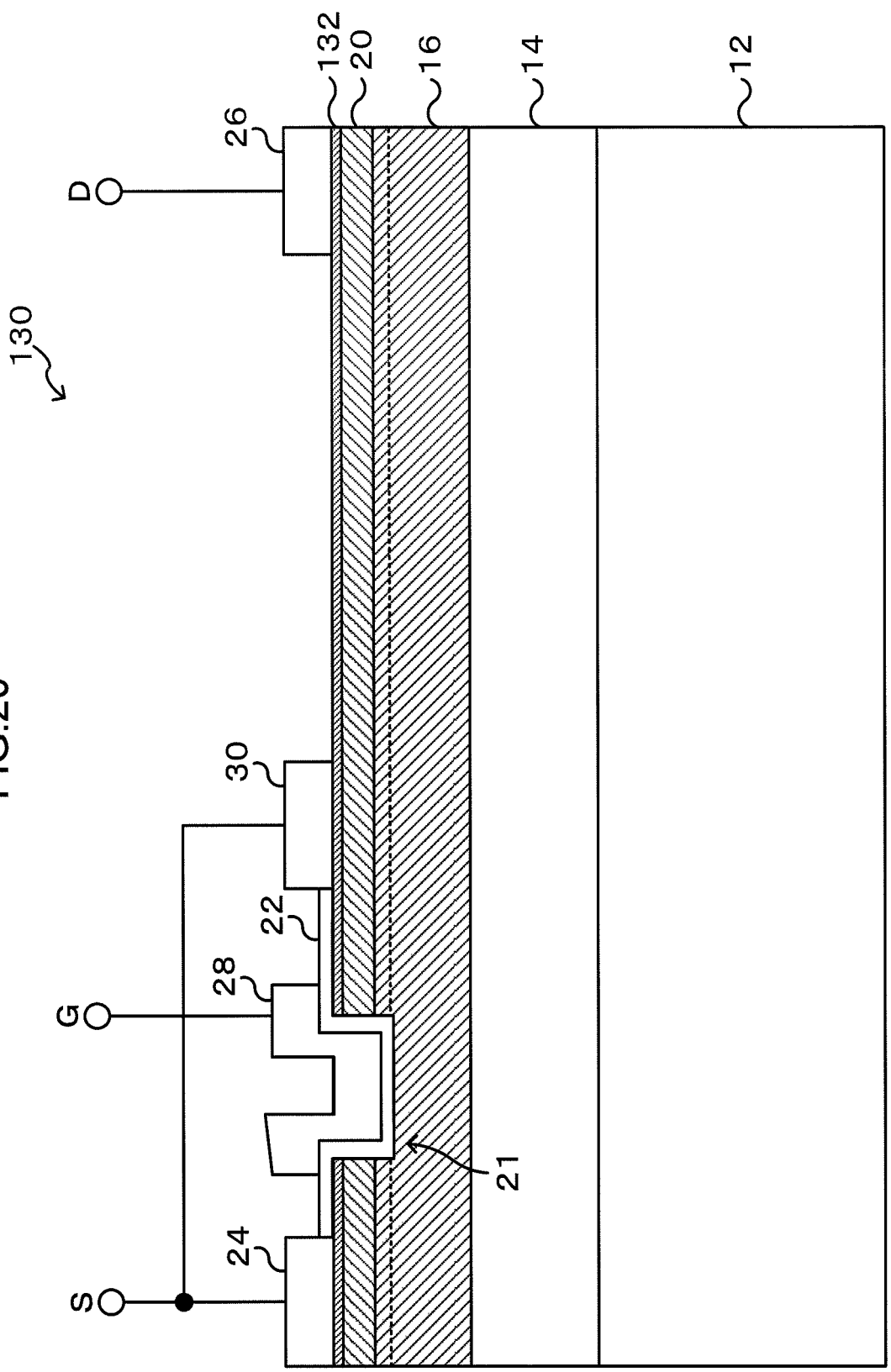
FIG. 20 is a cross-sectional view showing an example of the schematic structure of a nitride semiconductor element relating to a ninth embodiment of the present invention.

A cross-sectional view, that shows an example of the schematic structure of a nitride semiconductor element that is a nitride semiconductor device of the present embodiment, is shown in FIG. 20. In a nitride semiconductor element 130 of the present embodiment, a cap layer 132 that is formed of GaN is provided at the surface of the electron supplying layer 20. The film thickness of the cap layer 132 is preferably 0.5 to 10 nm.

By providing the cap layer 132 that is formed of GaN at the surface of the electron supplying layer 20 in this way, collapsing, in which the drain current is reduced at the time when a high voltage is applied, can be reduced.

Note that, in the present embodiment, as shown in FIG. 20, the cap layer 132 is provided at the entire surface of the electron supplying layer 20 except for the recess portion 21, but is not limited to this. It may be made such that the cap layer is not provided at the regions corresponding to beneath the source electrode 24, the drain electrode 26 and the SBD metal electrode 30.

Note that, although description and illustration thereof are omitted in the above-described first through ninth embodiments, it is preferable to provide, for example, a surface protecting film (a passivation film) that is formed of SiNx, at the entire surface of the nitride semiconductor element (the surface at the side at which the electron supplying layer is provided).

The invention claimed is:

1. A nitride semiconductor device comprising:
   a substrate;
   a buffer layer that is formed on the substrate;
   an electron traveling layer that is formed on the buffer layer and is formed of a nitride compound;
   an electron supplying layer that is formed on the electron traveling layer, and whose band gap energy is different than the electron traveling layer, and that is formed from at least one layer;
   a recess portion that is formed in a region from a surface of the electron supplying layer at least to the electron supplying layer;
   a source electrode and a drain electrode that are formed on the electron supplying layer at positions opposing one another across the recess portion;
   a gate insulating film that is formed from the recess portion over a surface of the electron supplying layer, so as to cover the recess portion interior;
   a gate electrode that is formed on the gate insulating film that is within the recess portion; and
   an electrode for carrier transport that is formed between the gate electrode and the drain electrode, and is connected to the source electrode, and is for transporting carrier to the source electrode.

2. The nitride semiconductor device of claim 1, wherein the electrode for carrier transport is Schottky-joined to at least one of the electron supplying layer or the electron traveling layer.

3. The nitride semiconductor device of claim 2, wherein the electrode for carrier transport is formed in a region from a surface of the electron supplying layer to a depth that reaches the electron supplying layer interior or the electron traveling layer interior.

4. The nitride semiconductor device of claim 1, comprising a semiconductor layer that is pn-joined to the electron supplying layer, wherein the electrode for carrier transport is ohmically-joined on the semiconductor layer.

5. The nitride semiconductor device of claim 1, comprising:
   a first n+ layer that is formed at a region beneath the gate insulating film from the source electrode until reaching a region beneath the recess portion, and that is connected to the source electrode; and
   a second n+ layer that is formed at a region beneath the gate insulating film from a region beneath the recess portion until reaching before the electrode for carrier transport, and that is not connected to the electrode for carrier transport.

6. The nitride semiconductor device of claim 5, wherein the electron supplying layer and the electron traveling layer of a region beneath the drain electrode are n+ layers.

7. The nitride semiconductor device of claim 1, wherein the electron traveling layer is formed of undoped GaN, and a thickness thereof is greater than or equal to 2 nm and less than or equal to 500 nm.

8. The nitride semiconductor device of claim 7, wherein the electron supplying layer is formed of AlGaN, and a thickness thereof is greater than or equal to 1 nm and less than or equal to 50 nm.

9. The nitride semiconductor device of claim 1, wherein a carrier concentration of two-dimensional electron gas that is generated at the electron traveling layer is greater than or equal to $2 \times 10^{12}$ cm$^{-2}$ and less than or equal to $2 \times 10^{13}$ cm$^{-2}$.

10. The nitride semiconductor device of claim 1, wherein the electron supplying layer has a layered structured in which at least two types of layers, whose compositions are different, are layered repeatedly.

11. The nitride semiconductor device of claim 8, wherein the electron supplying layer has, between the electron supplying layer and the electron traveling layer, a layer that is formed of AlN.

12. The nitride semiconductor device of claim 1, comprising:
   a field mitigating layer at a region between the electron supplying layer and the gate insulating film, other than a periphery of the recess portion,
   wherein the gate insulating film has a multi-step structure that corresponds to a step between the electron supplying layer and the field mitigating layer.

13. The nitride semiconductor device of claim 1, comprising a cap layer that is formed of GaN, at least at a region of the surface of the electron supplying layer where the source electrode, the drain electrode and the electrode for carrier transport are not formed.

14. The nitride semiconductor device of claim 1, comprising a protective film that is formed so as to cover a surface of the electron supplying layer at which the source electrode, the drain electrode and the electrode for carrier transport are formed.

15. The nitride semiconductor device of claim 1, wherein the recess portion is formed in a region from the surface of the electron supplying layer until reaching the electron traveling layer.

* * * * *